US010958379B2

(12) United States Patent
Kim et al.

(10) Patent No.: US 10,958,379 B2
(45) Date of Patent: Mar. 23, 2021

(54) MAPPING OF CHANNEL ENCODED BITS TO SYMBOL FOR RETRANSMISSION

(71) Applicant: QUALCOMM Incorporated, San Diego, CA (US)

(72) Inventors: Hobin Kim, San Diego, CA (US); Hari Sankar, San Diego, CA (US); Alexei Yurievitch Gorokhov, San Diego, CA (US); Michael Lee McCloud, San Diego, CA (US); Joseph Binamira Soriaga, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 180 days.

(21) Appl. No.: 15/973,365

(22) Filed: May 7, 2018

(65) Prior Publication Data

US 2018/0331788 A1 Nov. 15, 2018

Related U.S. Application Data

(60) Provisional application No. 62/505,437, filed on May 12, 2017.

(51) Int. Cl.
*H04L 1/08* (2006.01)
*H04L 1/18* (2006.01)
(Continued)

(52) U.S. Cl.
CPC ................ *H04L 1/08* (2013.01); *H04L 1/007* (2013.01); *H04L 1/0086* (2013.01);
(Continued)

(58) Field of Classification Search
CPC ... H04L 1/0003; H04L 1/1812; H04L 1/0067; H04L 1/08; H04L 1/0025; H04L 1/0058;
(Continued)

(56) References Cited

U.S. PATENT DOCUMENTS 6,865,233 B1 * 3/2005 Eriksson ............... H04L 1/0003 375/261
2009/0238066 A1 * 9/2009 Cheng .................. H04L 1/0067 370/216
2010/0067425 A1 3/2010 Chen et al.
2011/0158257 A1 6/2011 Kwon et al.
2012/0300691 A1 * 11/2012 Chao .................... H04L 5/0044 370/312
(Continued)

FOREIGN PATENT DOCUMENTS

DE 10124417 A1 11/2002

OTHER PUBLICATIONS

International Search Report and Written Opinion—PCT/US2018/031680—ISA/EPO—dated Jul. 26, 2018.

*Primary Examiner* — April Y Blair
*Assistant Examiner* — Sazzad Hossain
(74) *Attorney, Agent, or Firm* — Loza & Loza, LLP

(57) ABSTRACT

Aspects of the present disclosure relate to retransmissions of data within wireless communication networks. For a retransmission, at least a portion of the encoded bits of an original transmission may be mapped to different bit locations in one or more modulated symbols based on a non-random mapping rule. In some examples, the encoded bits of a symbol may be reversed within the symbol for a retransmission. In other examples, the first and last encoded bits within a symbol may be switched for a retransmission. Other non-random mapping rules, such as a bit location offset, may also be used to map encoded bits to different bit locations in the modulated symbol within a retransmission.

48 Claims, 11 Drawing Sheets

400
450
402 Encoder
404 Code Block
406 Symbol Mapper
408 Mapping Rule
410 Tone Mapper
412 DAC/RF
414
416 Channel
452
426 Mapping Rule
430 Decoder
428 Soft Combiner
424 Symbol De-Mapper
422 Tone De-Mapper
420 RF/ADC
418

(51) Int. Cl.
*H04L 1/00* (2006.01)
*H04W 92/10* (2009.01)
*H04L 5/00* (2006.01)
*H03M 13/00* (2006.01)
*H04L 27/34* (2006.01)

(52) U.S. Cl.
CPC ....... *H04L 1/1893* (2013.01); *H03M 13/6306* (2013.01); *H04L 1/0003* (2013.01); *H04L 1/0025* (2013.01); *H04L 1/0058* (2013.01); *H04L 1/0067* (2013.01); *H04L 1/1812* (2013.01); *H04L 5/001* (2013.01); *H04L 5/0046* (2013.01); *H04L 5/0055* (2013.01); *H04L 27/3483* (2013.01); *H04W 92/10* (2013.01)

(58) Field of Classification Search
CPC . H04L 27/3483; H04L 5/0055; H04L 1/0086; H03M 13/6306
See application file for complete search history.

(56) References Cited

U.S. PATENT DOCUMENTS

2013/0100994 A1* 4/2013 Merlin .................. H04L 1/1861 375/219
2014/0006890 A1* 1/2014 Liberg .................. H04L 1/1812 714/748
2015/0236818 A1 8/2015 Qi et al.
2018/0013477 A1* 1/2018 Kim ......................... H04B 7/06
2018/0199314 A1* 7/2018 Takeda .................... H04L 5/001

* cited by examiner

MAPPING OF CHANNEL ENCODED BITS TO SYMBOL FOR RETRANSMISSION

PRIORITY CLAIM

This application claims priority to and the benefit of Provisional Patent Application No. 62/505,437 filed in the U.S. Patent and Trademark Office on May 12, 2017, the entire content of which is incorporated herein by reference as if fully set forth below in its entirety and for all applicable purposes.

TECHNICAL FIELD

The technology discussed below relates generally to wireless communication systems, and more particularly, to retransmission of encoded bits within a wireless communication network.

BACKGROUND

Block codes, or other error correcting codes, are frequently used to provide reliable transmission of digital messages over noisy channels. In a typical block code transmission, an information message or sequence is split up into blocks, and an encoder at the transmitting device then mathematically adds redundancy to the information message. Exploitation of this redundancy in the encoded information message is the key to reliability of the message, enabling correction for any bit errors that may occur due to noise. That is, a decoder at the receiving device can take advantage of the redundancy to reliably recover the information message even though bit errors may occur, in part, due to the addition of noise to the channel.

Many examples of such error correcting codes are known to those of ordinary skill in the art, including Hamming codes, Bose-Chaudhuri-Hocquenghem (BCH) codes, turbo codes, low-density parity check (LDPC) codes, and convolutional codes, among others. Many existing wireless communication networks utilize such error correcting codes, such as 3GPP LTE networks, which utilize turbo codes; and IEEE 802.11n Wi-Fi networks, which utilize LDPC codes.

However, even with a robust error correcting code, channel conditions may vary such that from time to time a bit error rate may exceed that which may be corrected. In such a case, retransmission of all or part of a packet can further insure error-free communication. Hybrid automatic repeat request (HARQ) is one such retransmission scheme utilized in many existing communication networks. HARQ can act as a fall-back mechanism, providing for retransmissions when error correction schemes fail to correct for bit errors.

While error correcting codes and HARQ algorithms continue to rapidly advance the capabilities and potential of communication systems, additional enhancements are desired, particularly for potential deployment of future wireless communication networks beyond LTE.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of the disclosure relate to retransmission mechanisms within wireless communication networks. For a retransmission, at least a portion of the encoded bits of an original transmission may be mapped to different bit location in one or more modulated symbols based on a non-random mapping rule. In some examples, the encoded bits of a symbol may be reversed within the symbol for a retransmission. In other examples, the first and last encoded bits within a symbol may be switched for a retransmission. Other non-random mapping rules, such as a bit location offset, may also be used to map encoded bits to different bit locations in the modulated symbol for a retransmission.

In one aspect of the disclosure, a method of retransmission within a wireless communication network is provided. The method includes generating a first code block including first encoded bits and mapping the first encoded bits of the first code block to first symbols to produce a first transmission, in which each of the first encoded bits is mapped to a respective bit location of one of the first symbols. The method further includes transmitting the first transmission including the first symbols over a wireless air interface to a receiving device, receiving a negative acknowledgement (NACK) or no response, in response to the first transmission, and generating a second code block including second encoded bits, in which at least a portion of the second encoded bits include corresponding encoded bits that correspond to respective ones of the first encoded bits. The method further includes mapping the second encoded bits of the second code block to second symbols to produce a second transmission, in which at least a portion of the corresponding encoded bits are mapped to different bit locations within the second symbols than the first symbols based on a non-random mapping rule, and transmitting the second transmission including the second symbols over the wireless air interface to the receiving device.

Another aspect of the disclosure provides an apparatus configured for wireless communication. The apparatus includes a transceiver, a memory, and a processor communicatively coupled to the transceiver and the memory. The processor is configured to generate a first code block including first encoded bits and map the first encoded bits of the first code block to first symbols to produce a first transmission, in which each of the first encoded bits is mapped to a respective bit location of one of the first symbols. The processor is further configured to transmit the first transmission including the first symbols over a wireless air interface via the transceiver to a receiving device, receive a negative acknowledgement (NACK) or no response, in response to the first transmission via the transceiver, and generate a second code block including second encoded bits, in which at least a portion of the second encoded bits include corresponding encoded bits that correspond to respective ones of the first encoded bits. The processor is further configured to map the second encoded bits of the second code block to second symbols to produce a second transmission, in which at least a portion of the corresponding encoded bits are mapped to different bit locations within the second symbols than the first symbols based on a non-random mapping rule, and transmit the second transmission including the second symbols over the wireless air interface via the transceiver to the receiving device.

Another aspect of the disclosure provides a wireless communication device within a wireless communication network. The wireless communication device includes means for generating a first code block including first encoded bits and means for mapping the first encoded bits of the first code block to first symbols to produce a first transmission, in which each of the first encoded bits is mapped to a respective bit location of one of the first symbols. The wireless communication device further includes means for transmitting the first transmission including the first symbols over a wireless air interface to a receiving device, means for receiving a negative acknowledgement (NACK) or no response, in response to the first transmission, and means for generating a second code block including second encoded bits, in which at least a portion of the second encoded bits include corresponding encoded bits that correspond to respective ones of the first encoded bits. The wireless communication device further includes means for mapping the second encoded bits of the second code block to second symbols to produce a second transmission, in which at least a portion of the corresponding encoded bits are mapped to different bit locations within the second symbols than the first symbols based on a non-random mapping rule, and means for transmitting the second transmission including the second symbols over the wireless air interface to the receiving device.

Another aspect of the disclosure provides a method of decoding in a wireless communication network. The method includes receiving a first transmission including first encoded bits mapped to first symbols over a wireless air interface from a transmitting device, in which each of the first encoded bits is mapped to a respective bit location of one of the first symbols. The method further includes de-mapping the first transmission to produce a first code block including the first encoded bits, performing decoding of the first code block, and if decoding of the first code block fails, transmitting a negative acknowledgement (NACK) to the transmitting device. The method further includes receiving a second transmission including second encoded bits mapped to second symbols over the wireless air interface from the transmitting device, in which at least a portion of the second encoded bits include corresponding encoded bits that correspond to respective ones of the first encoded bits and at least a portion of the corresponding encoded bits are mapped to different bit locations within the second symbols than the first symbols based on a non-random mapping rule. The method further includes de-mapping the second transmission to produce a second code block including the second encoded bits and performing decoding of the first code block and the second code block by soft combining the corresponding encoded bits.

Another aspect of the disclosure provides an apparatus configured for wireless communication. The apparatus includes a transceiver, a memory, and a processor communicatively coupled to the transceiver and the memory. The processor is configured to receive a first transmission including first encoded bits mapped to first symbols over a wireless air interface via the transceiver from a transmitting device, in which each of the first encoded bits is mapped to a respective bit location of one of the first symbols. The processor is further configured to de-map the first transmission to produce a first code block including the first encoded bits, perform decoding of the first code block, and if decoding of the first code block fails, transmit a negative acknowledgement (NACK) to the transmitting device via the transceiver. The processor is further configured to receive a second transmission including second encoded bits mapped to second symbols over the wireless air interface via the transceiver from the transmitting device, in which at least a portion of the second encoded bits include corresponding encoded bits that correspond to respective ones of the first encoded bits and at least a portion of the corresponding encoded bits are mapped to different bit locations within the second symbols than the first symbols based on a non-random mapping rule. The processor is further configured to de-map the second transmission to produce a second code block including the second encoded bits and perform decoding of the first code block and the second code block by soft combining the corresponding encoded bits.

Another aspect of the disclosure provides a wireless communication device within a wireless communication network. The wireless communication device includes means for receiving a first transmission including first encoded bits mapped to first symbols over a wireless air interface from a transmitting device, in which each of the first encoded bits is mapped to a respective bit location of one of the first symbols. The wireless communication device further includes means for de-mapping the first transmission to produce a first code block including the first encoded bits, means for performing decoding of the first code block, and if decoding of the first code block fails, means for transmitting a negative acknowledgement (NACK) to the transmitting device. The wireless communication device further includes means for receiving a second transmission including second encoded bits mapped to second symbols over the wireless air interface from the transmitting device, in which at least a portion of the second encoded bits include corresponding encoded bits that correspond to respective ones of the first encoded bits and at least a portion of the corresponding encoded bits are mapped to different bit locations within the second symbols than the first symbols based on a non-random mapping rule. The wireless communication device further includes means for de-mapping the second transmission to produce a second code block including the second encoded bits and means for performing decoding of the first code block and the second code block by soft combining the corresponding encoded bits.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes and constitution.

Figure 1:
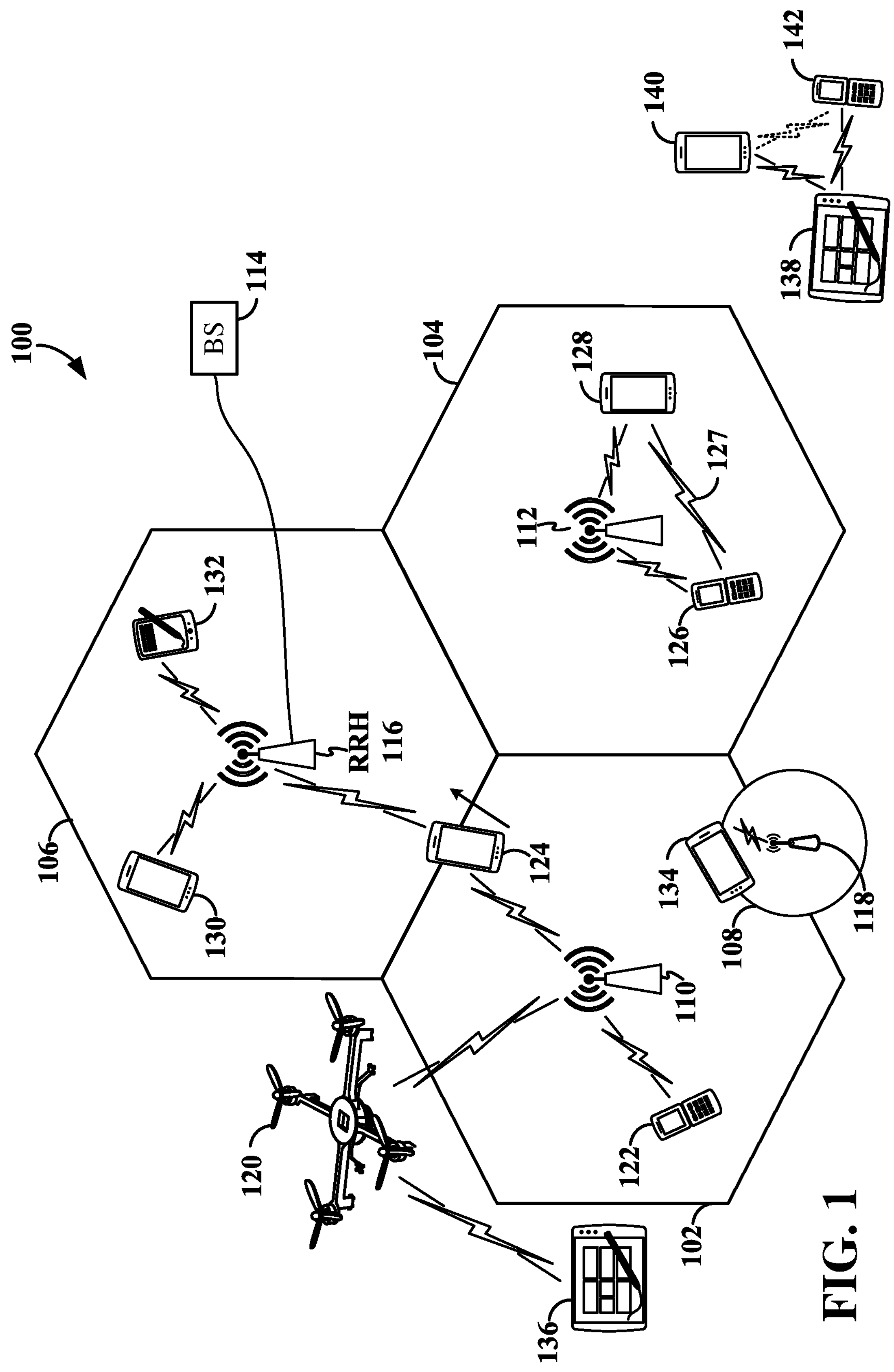
FIG. 1 is a diagram illustrating an example of a radio access network.

The various concepts presented throughout this disclosure may be implemented across a broad variety of telecommunication systems, network architectures, and communication standards. Referring now to FIG. 1, as an illustrative example without limitation, a schematic illustration of a radio access network (RAN) 100 is provided. As one example, the RAN 100 may operate according to 3rd Generation Partnership Project (3GPP) New Radio (NR) specifications, often referred to as 5G. As another example, the RAN 100 may operate under a hybrid of 5G NR and Evolved Universal Terrestrial Radio Access Network (eUTRAN) standards, often referred to as LTE. The 3GPP refers to this hybrid RAN as a next-generation RAN, or NG-RAN. Of course, many other examples may be utilized within the scope of the present disclosure.

The geographic area covered by the RAN 100 may be divided into a number of cellular regions (cells) that can be uniquely identified by a user equipment (UE) based on an identification broadcasted from one access point or base station. FIG. 1 illustrates macrocells 102, 104, and 106, and a small cell 108, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, a respective base station (BS) serves each cell. Broadly, a base station is a network element in a radio access network responsible for radio transmission and reception in one or more cells to or from a UE. In different technologies, standards, or contexts, a base station may variously be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB), or some other suitable terminology.

In FIG. 1, two base stations 110 and 112 are shown in cells 102 and 104; and a third base station 114 is shown controlling a remote radio head (RRH) 116 in cell 106. That is, a base station can have an integrated antenna or can be connected to an antenna or RRH by feeder cables. In the illustrated example, the cells 102, 104, and 106 may be referred to as macrocells, as the base stations 110, 112, and 114 support cells having a large size. Further, a base station 118 is shown in the small cell 108 (e.g., a microcell, picocell, femtocell, home base station, home Node B, home eNode B, etc.) which may overlap with one or more macrocells. In this example, the cell 108 may be referred to as a small cell, as the base station 118 supports a cell having a relatively small size.

It is to be understood that the radio access network 100 may include any number of wireless base stations and cells. Further, a relay node may be deployed to extend the size or coverage area of a given cell. The base stations 110, 112,

114, 118 provide wireless access points to a core network for any number of mobile apparatuses.

In general, base stations may include a backhaul interface for communication with a backhaul portion (not shown) of the network. The backhaul may provide a link between a base station and a core network (not shown). The core network may be a part of a wireless communication system and may be independent of the radio access technology used in the radio access network. In some examples, the core network may be configured according to 5G standards (e.g., 5GC). In other examples, the core network may be configured according to a 4G evolved packet core (EPC), or any other suitable standard or configuration. Further, in some examples, a backhaul network may provide interconnection between the respective base stations. Various types of backhaul interfaces may be employed, such as a direct physical connection, a virtual network, or the like using any suitable transport network.

The RAN 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. UEs may include a number of hardware structural components sized, shaped, and arranged to help in communication; such components can include antennas, antenna arrays, RF chains, amplifiers, one or more processors, etc. electrically coupled to each other. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of Things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Within the RAN 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with base station 118; and UE 136 may be in communication with mobile base station 120. Here, each base station 110, 112, 114, 118, and 120 may be configured to provide an access point to a core network (not shown) for all the UEs in the respective cells. UEs may comprise a number of hardware structural components sized, shaped, and arranged to help in communication; such components can include antennas, antenna arrays, RF chains, amplifiers, one or more processors, etc. electrically coupled to each other.

In another example, an unmanned aerial vehicle (UAV) 120, which may be a drone or quadcopter, can be a mobile network node and may be configured to function as a UE. For example, the UAV 120 may operate within cell 102 by communicating with base station 110.

Wireless communication between the RAN 100 and a UE (e.g., UE 122) may be described as utilizing an air interface. Transmissions over the air interface from a base station (e.g., base station 110) to one or more UEs (e.g., UE 122) may be referred to as downlink (DL) transmissions. In accordance with certain aspects of the present disclosure, the term downlink may refer to a point-to-multipoint transmission originating at a scheduling entity (described further below; e.g., base station 110). Another way to describe this scheme may be to use the term broadcast channel multiplexing. Transmissions from a UE (e.g., UE 122) to a base station (e.g., base station 110) may be referred to as uplink (UL) transmissions. In accordance with further aspects of the present disclosure, the term uplink may refer to a point-to-point transmission originating at a scheduled entity (described further below; e.g., UE 122).

In addition, the uplink and/or downlink transmissions may be time-divided into frames, subframes, slots, and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols. A subframe may refer to a duration of 1 ms. Multiple subframes or slots may be grouped together to form a single frame or radio frame. Of course, these definitions are not required, and any suitable scheme for organizing waveforms may be utilized, and various time divisions of the waveform may have any suitable duration.

The air interface in the RAN 100 may utilize one or more multiplexing and multiple access algorithms to enable simultaneous communication of the various devices. For example, 5G NR specifications provide multiple access for UL transmissions from UEs 122 and 124 to base station 110, and for multiplexing DL transmissions from base station 110 to one or more UEs 122 and 124, utilizing orthogonal frequency division multiplexing (OFDM) with a cyclic prefix (CP). In addition, for UL transmissions, 5G NR specifications provide support for discrete Fourier transform-spread-OFDM (DFT-s-OFDM) with a CP (also referred to as single-carrier FDMA (SC-FDMA)). However, within the scope of the present disclosure, multiplexing and multiple access are not limited to the above schemes, and may be provided utilizing time division multiple access (TDMA), code division multiple access (CDMA), frequency division multiple access (FDMA), sparse code multiple access (SCMA), resource spread multiple access (RSMA), or other suitable multiple access schemes. Further, multiplexing DL transmissions from the base station 110 to UEs 122 and 124 may be provided utilizing time division multiplexing (TDM), code division multiplexing (CDM), frequency division multiplexing (FDM), orthogonal frequency division multiplexing (OFDM), sparse code multiplexing (SCM), or other suitable multiplexing schemes.

The air interface in the RAN 100 may further utilize one or more duplexing algorithms Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per subframe.

In the radio access network 100, the ability for a UE to communicate while moving, independent of their location, is referred to as mobility. The various physical channels between the UE and the radio access network are generally set up, maintained, and released under the control of an access and mobility management function (AMF), which may include a security context management function (SCMF) that manages the security context for both the control plane and the user plane functionality and a security anchor function (SEAF) that performs authentication.

A radio access network 100 may utilize DL-based mobility or UL-based mobility to enable mobility and handovers (i.e., the transfer of a UE's connection from one radio channel to another). In a network configured for DL-based mobility, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 124 may move from the geographic area corresponding to its serving cell 102 to the geographic area corresponding to a neighbor cell 106. When the signal strength or quality from the neighbor cell 106 exceeds that of its serving cell 102 for a given amount of time, the UE 124 may transmit a reporting message to its serving base station 110 indicating this condition. In response, the UE 124 may receive a handover command, and the UE may undergo a handover to the cell 106.

In a network configured for UL-based mobility, UL reference signals from each UE may be utilized by the network to select a serving cell for each UE. In some examples, the base stations 110, 112, and 114/116 may broadcast unified synchronization signals (e.g., unified Primary Synchronization Signals (PSSs), unified Secondary Synchronization Signals (SSSs) and unified Physical Broadcast Channels (PBCH)). The UEs 122, 124, 126, 128, 130, and 132 may receive the unified synchronization signals, derive the carrier frequency and subframe/slot timing from the synchronization signals, and in response to deriving timing, transmit an uplink pilot or reference signal. The uplink pilot signal transmitted by a UE (e.g., UE 124) may be concurrently received by two or more cells (e.g., base stations 110 and 114/116) within the radio access network 100. Each of the cells may measure a strength of the pilot signal, and the radio access network (e.g., one or more of the base stations 110 and 114/116 and/or a central node within the core network) may determine a serving cell for the UE 124. As the UE 124 moves through the radio access network 100, the network may continue to monitor the uplink pilot signal transmitted by the UE 124. When the signal strength or quality of the pilot signal measured by a neighboring cell exceeds that of the signal strength or quality measured by the serving cell, the radio access network 100 may handover the UE 124 from the serving cell to the neighboring cell, with or without informing the UE 124.

Although the synchronization signal transmitted by the base stations 110, 112, and 114/116 may be unified, the synchronization signal may not identify a particular cell, but rather may identify a zone of multiple cells operating on the same frequency and/or with the same timing. The use of zones in 5G networks or other next generation communication networks enables the uplink-based mobility framework and improves the efficiency of both the UE and the network, since the number of mobility messages that need to be exchanged between the UE and the network may be reduced.

In various implementations, the air interface in the radio access network 100 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

In some examples, access to the air interface may be scheduled, wherein a scheduling entity (e.g., a base station) allocates resources (e.g., time-frequency resources) for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs, which may be scheduled entities, may utilize resources allocated by the scheduling entity. Base stations are not the only entities that may function as a scheduling entity. That is, in some examples, a UE may function as a scheduling entity, scheduling resources for one or more scheduled entities (e.g., one or more other UEs).

A scheduling entity may broadcast downlink traffic to one or more scheduled entities. Broadly, the scheduling entity is a node or device responsible for scheduling traffic in a wireless communication network, including the downlink traffic and, in some examples, uplink traffic from one or more scheduled entities to the scheduling entity. On the other hand, the scheduled entity is a node or device that receives downlink control information, including but not limited to scheduling information (e.g., a grant), synchronization or timing information, or other control information from another entity in the wireless communication network such as the scheduling entity.

In a further aspect of the RAN 100, sidelink signals may be used between UEs without necessarily relying on scheduling or control information from a base station. For example, two or more UE (e.g., UEs 126 and 128) may communicate with each other using peer to peer (P2P) or sidelink signals 127 without relaying that communication through a base station (e.g., base station 112). In a further example, UE 138 is illustrated communicating with UEs 140 and 142. Here, the UE 138 may function as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138. Thus, in a wireless communication system with scheduled access to time-frequency resources and having a cellular configuration, a P2P configuration, or a mesh configuration, a scheduling entity and one or more scheduled entities may communicate utilizing the scheduled resources. In some examples, the sidelink signals 127 include sidelink traffic and sidelink control. Sidelink control information may in some examples include a request signal, such as a request-to-send (RTS), a source transmit signal (STS), and/or a direction selection signal (DSS). The request signal may provide for a scheduled entity to request a duration of time to keep a sidelink channel available for a sidelink signal. Sidelink control information may further include a response signal, such as a clear-to-send (CTS) and/or a destination receive signal (DRS). The response signal may provide for the scheduled entity to indicate the availability of the sidelink channel, e.g., for a requested duration of time. An exchange of request and response signals (e.g., handshake) may enable different scheduled entities performing sidelink communications to negotiate the availability of the sidelink channel prior to communication of the sidelink traffic information.

Figure 2:
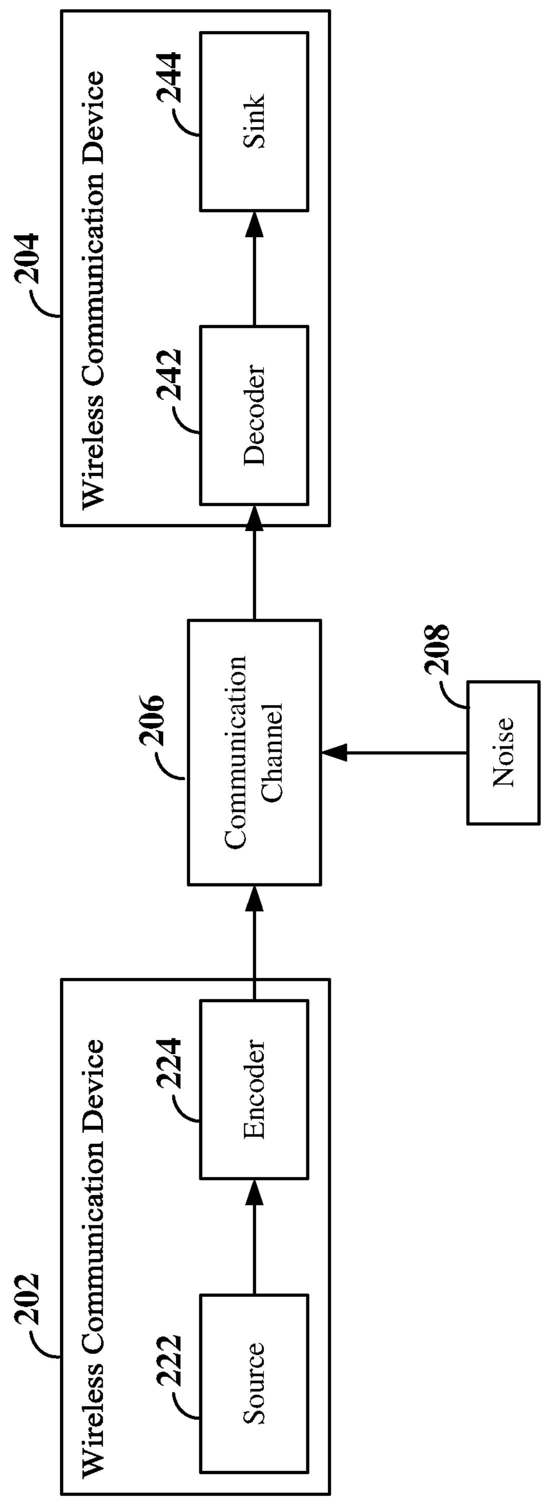
FIG. 2 is a schematic illustration of wireless communication utilizing an encoding scheme.

FIG. 2 is a schematic illustration of wireless communication between a first wireless communication device 202 and a second wireless communication device 204. Each wireless communication device 202 and 204 may be a user equipment (UE), a base station, or any other suitable apparatus or means for wireless communication. In the illustrated example, a source 222 within the first wireless communication device 202 transmits a digital message over a communication channel 206 (e.g., a wireless channel over an air interface) to a sink 244 in the second wireless communication device 204. One issue in such a scheme that must be addressed to provide for reliable communication of the digital message, is to take into account the noise 208 that affects the communication channel 206.

Error correcting codes are frequently used to provide reliable transmission of digital messages over such noisy channels. Examples of error correcting codes include block codes and convolutional codes. Convolutional codes convert the entire information message or sequence into a single codeword or code block, where the encoded bits depend not only on current information bits in the information message, but also on past information bits in the information message, thus providing redundancy.

For example, an encoder 224 at the first (transmitting) wireless communication device 202 may use a sliding window to calculate parity bits by combining various subsets of the information bits in the window. The calculated parity bits may then be transmitted over the channel. Exploitation of the redundancy provided by the parity bits is the key to reliability of the message, enabling correction for any bit errors that may occur due to the noise 208. As an example, if a convolutional code produces r parity bits per window and slides the window forward by one bit at a time, its rate is 1/r. Since the parity bits are the only bits transmitted, the greater the value of r, the greater the resilience to bit errors. That is, a decoder 242 at the second (receiving) wireless communication device 204 can take advantage of the redundancy provided by the parity bits to reliably recover the information message even though bit errors may occur, in part, due to the addition of noise 208 to the channel.

Block codes split the information message up into blocks, each block having a length of K information bits. The encoder 224 at the first (transmitting) wireless communication device 202 then mathematically adds redundancy (e.g., parity bits) to the information message, resulting in codewords or code blocks having a length of N, where N>K. Here, the code rate R is the ratio between the message length and the block length: i.e., R=K/N. Thus, with block codes, the information bits are transmitted together with the parity bits. That is, the decoder 242 at the second (receiving) wireless communication device 204 can take advantage of the redundancy provided by the parity bits to reliably recover the information message even though bit errors may occur, in part, due to the addition of noise 208 to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. In addition, for 5G NR networks, a new category of block codes, called polar codes, presents a potential opportunity for reliable and efficient information transfer with improved performance relative to other codes.

In early 5G NR specifications, user data traffic is coded using quasi-cyclic LDPC coding with two different base graphs: one base graph is used for large code blocks and/or high code rates, while the other base graph is used otherwise. Control information and the physical broadcast channel (PBCH) are coded using polar coding, based on nested sequences. For these channels, puncturing, shortening, and repetition are used for rate matching.

However, even with the best error correcting codes, if the communication channel 206 experiences a very large amount of noise 208, or experiences a deep fade or other issue, the bit error rate may exceed what can be compensated. Accordingly, many wireless communication networks utilize a hybrid automatic repeat request (HARQ) scheme to further improve data reliability. In a HARQ algorithm, the transmitting device 202 may retransmit coded information blocks (e.g., encoded using convolutional or block codes) if the first transmission is not decoded correctly at the receiving wireless communication device 204. To facilitate this process, a transmitted code block may include a cyclic redundancy check (CRC) portion, a checksum, or any other suitable mechanism known to those of ordinary skill in the art to determine whether the code block is decoded properly at the receiving device 204. If the received code block is properly decoded, then the receiving device 204 may transmit an acknowledgment (ACK), informing the transmitting device 202 that a retransmission is not needed. However, if the received code block is not properly decoded, then the receiving device 204 may transmit a negative acknowledgment (NACK) requesting a retransmission. In general, a limited number of retransmissions will be made before the transmission attempt is terminated. Many existing networks limit their HARQ algorithms to four retransmissions. However, any suitable retransmission limit may be utilized in a network within the scope of the present disclosure.

There are two main types or categories of HARQ algorithms: chase-combining HARQ (HARQ-CC) and incremental redundancy HARQ (HARQ-IR). In HARQ-CC, a retransmitted code block is identical to the original transmission of the code block. That is, if a code block is not decoded properly at the receiving device 204, resulting in a NACK, then the transmitting device 202 may retransmit the full code block including identical information to the original transmission. The information may then ideally be obtained error-free by virtue of a process called soft combining, where the redundant bits from the retransmission may be combined with the original transmitted bits before decoding to increase the probability of correct reception of each bit.

On the other hand, in HARQ-IR, the retransmitted code block may be different from the originally transmitted code block, and further, if multiple retransmissions are made, each retransmission may differ from one another. Here, retransmissions may include different sets of coded bits: for example, corresponding to different code rates or algorithms; corresponding to different portions of the original information block, some of which may not have been transmitted in the original transmission; corresponding to forward error correction (FEC) bits that were not transmitted in the original transmission; or other suitable schemes. As with HARQ-CC, here, the information may be obtained error-free by utilizing soft combining to combine the retransmitted bits with the original transmitted bits.

Regardless of the type of HARQ utilized, each transmission (including the first transmission) includes one or more modulated symbols, each representing a number (N) of encoded bits, where $N=\log_2 M$ bits/symbol and M indicates the modulation order (e.g., the number of finite states of the symbol). For example, each symbol may be modulated using binary phase shift keying (BPSK), which has a modulation order of two, quadrature phase shift keying (QPSK), which has a modulation order of four, or a higher-order modulation (e.g., M-quadrature amplitude modulation (QAM)), which has a modulation order of M. In some examples, each symbol may be an OFDM symbol, which may then be mapped to a resource element in a slot. Thus, higher order modulations may be utilized to increase the throughput by increasing the number of bits transmitted within a symbol.

However, for higher order modulations, within a particular symbol, the encoded bits may be mapped to bit locations having different reliability metrics. For example, the first encoded bit within a symbol may be considered the most significant bit (MSB) having the highest reliability, whereas the last encoded bit within the symbol may be considered the least significant bit having the lowest reliability. An example of a reliability metric is the log likelihood ratio (LLR). Even with random bit interleaving of HARQ retransmissions, it is possible that some of the encoded bits may be transmitted through consecutive LSB's of symbols, which may prevent the receiver from decoding the code block. For example, when performing soft combining of multiple transmissions (or LLRs) on a bit by bit basis, if the LSB's in multiple symbols contain the same encoded bits, the code block may not be properly decoded.

Therefore, in accordance with various aspects of the present disclosure, to improve the decoding performance at the receiver, at least a portion of the encoded bits of an original transmission may be mapped to different locations in the modulated symbol of a retransmission based on a non-random mapping rule. In some examples, the encoded bits of a symbol may be reversed within the symbol for a retransmission. In other examples, the first and last encoded bits within a symbol may be switched. Other non-random mapping rules, such as a bit location offset, may also be used to map encoded bits to different bit locations in a modulated symbol for a retransmission.

Figure 3:
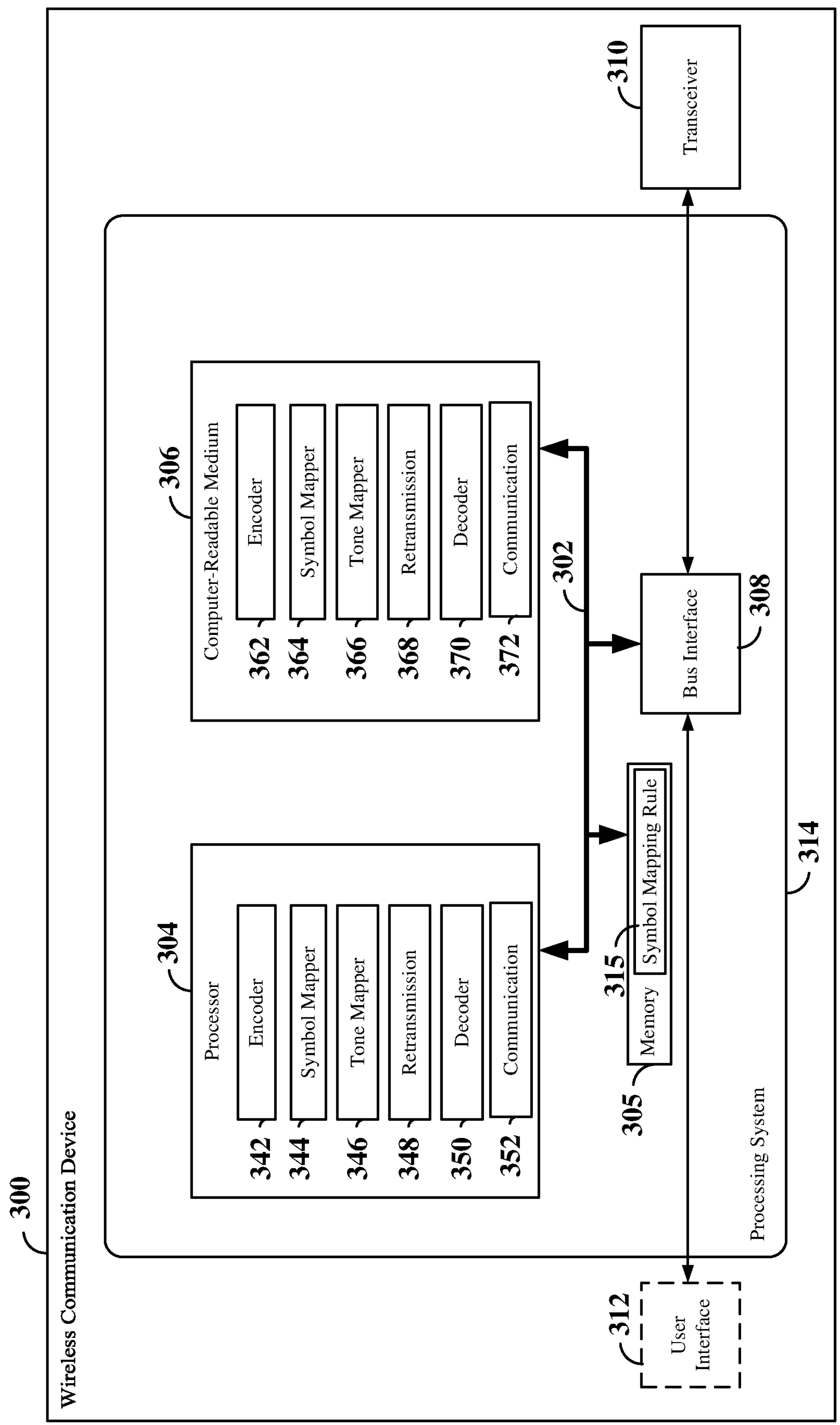
FIG. 3 is a block diagram illustrating an example of a hardware implementation for a wireless communication device employing a processing system, in accordance with some aspects of the present disclosure.

FIG. 3 is a block diagram illustrating an example of a hardware implementation for a wireless communication device 300 employing a processing system 314, which may be configured to carry out one or more of the processes and algorithms disclosed herein. That is, in accordance with various aspects of the disclosure, an element, or any portion of an element, or any combination of elements may be implemented with a processing system 314 that includes one or more processors 304. For example, the wireless communication device 300 may be a user equipment (UE), a base station, or any other suitable apparatus or means for wireless communication. The wireless communication device 300 may correspond to the wireless communication device 202 or the wireless communication device 204 shown in FIG. 2.

Examples of processors 304 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. That is, the processor 304, as utilized in a wireless communication device 300, may be used to implement any one or more of the processes described herein. The processor 304 may in some instances be implemented via a baseband or modem chip and in other implementations, the processor 304 may itself comprise a number of devices distinct and different from a baseband or modem chip (e.g., in such scenarios is may work in concert to achieve embodiments discussed herein). And as mentioned above, various hardware arrangements and components outside of a baseband modem processor can be used in implementations, including RF-chains, power amplifiers, modulators, buffers, interleavers, adders/summers, etc.

In this example, the processing system 314 may be implemented with a bus architecture, represented generally by the bus 302. The bus 302 may include any number of interconnecting buses and bridges depending on the specific application of the processing system 314 and the overall design constraints. The bus 302 links together various circuits including one or more processors (represented generally by the processor 304), a memory 305, and computer-readable media (represented generally by the computer-readable storage medium 306). The bus 302 may also link various other circuits such as timing sources, peripherals, voltage regulators, and power management circuits, which are well known in the art, and therefore, will not be described any further. A bus interface 308 provides an interface between the bus 302 and a transceiver 310. The transceiver 310 provides a means for communicating with various other apparatus over a transmission medium. Depending upon the nature of the apparatus, an optional user interface 312 (e.g., keypad, display, speaker, microphone, joystick) may also be provided.

The processor 304 is responsible for managing the bus 302 and general processing, including the execution of software stored on the computer-readable storage medium 306. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software, when executed by the processor 304, causes the processing system 314 to perform the various functions described below for any particular apparatus. The computer-readable storage medium 306 may also be used for storing data that is manipulated by the processor 304 when executing software.

The computer-readable medium 306 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium 306 may reside in the processing system 314, external to the processing system 314, or distributed across multiple entities including the processing system 314. The computer-readable medium 306 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In some aspects of the disclosure, the processor 304 may include circuitry configured for various functions. For example, the processor 304 may include an encoder 342, which may in some examples operate in coordination with encoding software 352 stored in the computer-readable storage medium 306. The encoder 342 may be configured to encode an original information message (e.g., a sequence of information bits) to produce a code block including a plurality of encoded bits. The encoder 342 may utilize any suitable encoding method, including but not limited to, convolutional coding, turbo coding, trellis coding, polar coding, Hamming coding, Bose-Chaudhuri-Hocquenghem (BCH) coding, and low-density parity check (LDPC) coding. Thus, the encoded bits may include a combination of systematic bits and parity bits or only parity bits, depending on the encoding method used. The encoder 342 may correspond in some examples to the encoder 224 shown in FIG. 2.

The processor 304 may further include a symbol mapper 344, which may in some examples operate in coordination with symbol mapping software 354 stored in the computer-readable storage medium 306. The symbol mapper 344 may be configured to digitally modulate the code block by mapping the encoded bits to symbols to produce a transmission. The symbol mapper 344 may utilize any suitable type of modulation, including but not limited to BPSK, QPSK, 16-QAM, 64-QAM, 256-QAM, or any other M-QAM. For example, when using 64-QAM, the symbol mapper 344 may map six encoded bits to each symbol. As another example, when using 256-QAM, the symbol mapper 344 may map eight bits to each symbol. The number of bits mapped to each symbol may be equal to $\log_2 M$, where M indicates the modulation order (e.g., the number of finite states of the symbol). The symbol mapper 344 may further map the encoded bits to specific bit locations within the symbol. For example, for an M-QAM symbol, the symbol mapper 344 may map the encoded bits to the symbol in the following bit order $[0, 1, 2, \ldots, \log_2(M-2), \log_2(M-1)]$.

It should be understood that the symbol mapper 344 may further operate as a symbol de-mapper to de-map the symbols in a received transmission to produce a code block. For example, the symbol de-mapper may demodulate the received modulated symbols and recover the encoded bits (e.g., the code block).

The processor 304 may further include a tone mapper 346, which may in some examples operate in coordination with tone mapping software 356 stored in the computer-readable storage medium 306. The tone mapper 346 may be configured to map each of the symbols within the code block to a different tone or subcarrier to be carried in a different resource element (e.g., time-frequency resource) of a slot. The code block may then be sent to a receiving device via the transceiver 310. It should be understood that the tone mapper 346 may further operate as a tone de-mapper to perform sub-carrier de-mapping of a received transmission to produce the modulated symbols containing the encoded bits.

Further, the processor may include retransmission circuitry 348, which may in some examples operate in coordination with retransmission software 358 stored in the computer-readable storage medium. The retransmission circuitry 348 may be configured to determine whether decoding of the code block by the receiving device has failed (e.g., by receiving a NACK from the receiving device via the transceiver 310) or that no response has been received from the receiving device. If the decoding failed or no response is received, the retransmission circuitry 348 may be configured to execute a retransmission algorithm for retransmission of the code block (hereinafter referred to as the original code block). In some examples, the retransmission algorithm is a chase combining HARQ (HARQ-CC) algorithm. In other examples, the retransmission algorithm is an incremental redundancy HARQ (HARQ-IR) algorithm.

In accordance with various aspects of the present disclosure, the retransmission circuitry 348 is further configured to operate in coordination with the encoder 342 and symbol mapper 344 to generate a retransmitted code block and to map the encoded bits of the retransmitted code block to different bit locations within the symbols than the original transmission. In some examples, the encoder 342 may re-encode the information message to produce the retransmitted code block. In other examples, the encoder 342 may buffer the original code block within, for example, memory 305, and the retransmission circuitry 348 may retrieve the original code block from memory 305 for re-mapping by the symbol mapper 344. In examples where HARQ-CC is utilized, the retransmitted code block includes the same encoded bits (e.g., the same systematic bits and parity bits or the same parity bits). In examples where HARQ-IR is utilized, the retransmitted code block may include different encoded bits (e.g., different systematic and/or parity bits). In some examples, the retransmitted code block may further include new information bits (e.g., information bits not previously transmitted).

Regardless of whether HARQ-CC or HARQ-IR is utilized, at least a portion of the encoded bits of the retransmitted code block correspond to (are the same as) the encoded bits of the original code block. In various aspects of the disclosure, the symbol mapper 344 is further configured to map at least a portion of the corresponding encoded bits (e.g., the encoded bits in both the original and retransmitted code blocks) to different bit locations within the symbols based on a symbol mapping rule 315, which may be maintained, for example, in memory 305. In some examples, the retransmission circuitry 348 or the symbol mapper 344 may identify the corresponding encoded bits and determine the bit locations assigned to the corresponding encoded bits in the original transmission. Based on this mapping information, the symbol mapper 344 may then utilize the symbol mapping rule 315 to map at least a portion of the corresponding encoded bits to different bit locations in the modulated symbols in the retransmission.

The symbol mapping rule 315 provides a non-random mapping of encoded bits to bit locations in a modulated symbol for an original transmission and each retransmission. In some examples, the first transmission may include first symbols, each including a respective first set of encoded bits arranged in a first bit order from a most significant bit (MSB) location to a least significant bit (LSB) location. Then, the retransmission may include second symbols, each corresponding to one of the first symbols transmitted previously and each including a respective second set of encoded bits arranged in a second bit order from the MSB location to the LSB location. For corresponding symbols (e.g., first and second symbols that correspond between the first and second transmissions), the symbol mapping rule 315 may specify how the first and second bit orders differ or how the first set of encoded bits are mapped to the second set of encoded bits.

In some examples, the symbol mapping rule 315 may provide that the first and last encoded bits within a particular symbol be switched. For example, the encoded bit in the MSB location of the symbol in the first transmission (original transmission) may be referred to herein as an initial encoded bit, whereas the encoded bit in the LSB location of the symbol in the original transmission may be referred to herein as a last encoded bit. Based on the symbol mapping rule 315, the symbol mapper 344 may map the initial encoded bit to the LSB location and the last encoded bit to the MSB location of the symbol in the retransmission.

In other examples, the symbol mapping rule 315 may provide that the first bit order is reversed to produce the second bit order. For example, assuming a first bit order of $[b_0, b_1, b_2, \ldots, b_{log\ 2(M-2)}, b_{log\ 2(M-1)}]$, the second bit order may be represented as $[b_{log(M-1)}, b_{log\ 2(M-2)}, \ldots, b_2, b_1, b_0]$.

In still other examples, the symbol mapping rule 315 may provide a bit location offset between the first bit order and the second bit order. For example, the symbol mapping rule 315 may specify that the encoded bits be shifted up two bit locations within a symbol in the retransmission. In this example, the encoded bits in the first two bit locations (e.g., the MSB location and the immediately adjacent bit location) may be shifted to the last two bit locations (e.g., the LSB bit location and the immediately adjacent bit location).

It should be understood that any suitable symbol mapping rule 315 may be utilized. In addition, different symbol mapping rules 315 may be utilized for different symbols, different types of modulation, different numbers of retransmissions, and/or different types of HARQ. For example, the symbol mapping rule 315 may specify that encoded bits transmitted within the LSB location, the lower half of the bit locations (e.g., the half of the bit locations having the lowest reliability) or any bit location other than the MSB location in the original transmission be mapped to a higher reliability bit location in the retransmission.

Further, the processor 304 may include a decoder 350, which may in some examples operate in coordination with decoding software 360 stored in the computer-readable storage medium 306. The decoder 350 may be configured to receive an original code block (first code block) from a transmitting device via the transceiver 310 and decode the first code block to produce the original information message. If decoding of the first code block fails, the decoder 350 may inform the retransmission circuitry 348, and the retransmission circuitry 348 may in turn generate and transmit a NACK to the transmitting device. In response to the NACK, the decoder 350 may receive a retransmitted code block (second code block) from the transmitting device via the transceiver 310.

In accordance with various aspects of the disclosure, the decoder 350 may then attempt to decode the code block by soft combining corresponding encoded bits of the first and second transmissions based on the symbol mapping rule 315 utilized for the second transmission and utilizing any additional parity bits transmitted within the second transmission. In some examples, the retransmission circuitry 348 may soft combine the corresponding encoded bits based on the symbol mapping rule 315 prior to decoding by the decoder 350. If the first code block is still not successfully decoded, the retransmission circuitry 348 may generate and transmit another NACK to the transmitting device to cause a third transmission that may utilize a different symbol mapping rule than the second transmission. This process may be repeated until either the code block is correctly decoded or is considered lost (e.g., no additional retransmissions are available). The decoder 350 may correspond in some examples to the decoder 242 shown in FIG. 2.

The processor 304 may further include communication circuitry 362, which may in some examples operate in coordination with communication software 372 stored in the computer-readable storage medium 306. The communication circuitry 362 may include one or more hardware components that provide the physical structure that performs various processes related to wireless communication (e.g., signal reception and/or signal transmission) via the transceiver 310 as described herein. For example, the communication circuitry 362 may be configured to transmit and/or receive a transmission included encoded bits, as described above.

As another example, the communication circuitry 362 may be configured to transmit and/or receive the symbol mapping rules 315. For example, the symbol mapping rule 315 may be transmitted from a base station to a user equipment via a radio resource control (RRC) message, master information block (MIB), system information block (SIB), or downlink control information (DCI). In this example, the symbol mapping rule 315 may include two or more symbol mapping rules and the UE (or base station) may further select one of the symbol mapping rules 315 and transmit the selected symbol mapping rule 315 to the base station (or UE). In other examples, the symbol mapping rule 315 may be predetermined and stored on both the transmitting and receiving devices. In this example, the symbol mapping rule 315 may include two or more symbol mapping rules and a selected symbol mapping rule (e.g., selected by the base station or UE) may be transmitted or indicated to the other device.

The circuitry included in the processor 304 is provided as non-limiting examples. Other means for carrying out the described functions exists and is included within various aspects of the present disclosure. In some aspects of the disclosure, the computer-readable medium 306 may store computer-executable code with instructions configured to perform various processes described herein. The instructions included in the computer-readable medium 306 are provided as non-limiting examples. Other instructions configured to carry out the described functions exist and are included within various aspects of the present disclosure.

Figure 4:
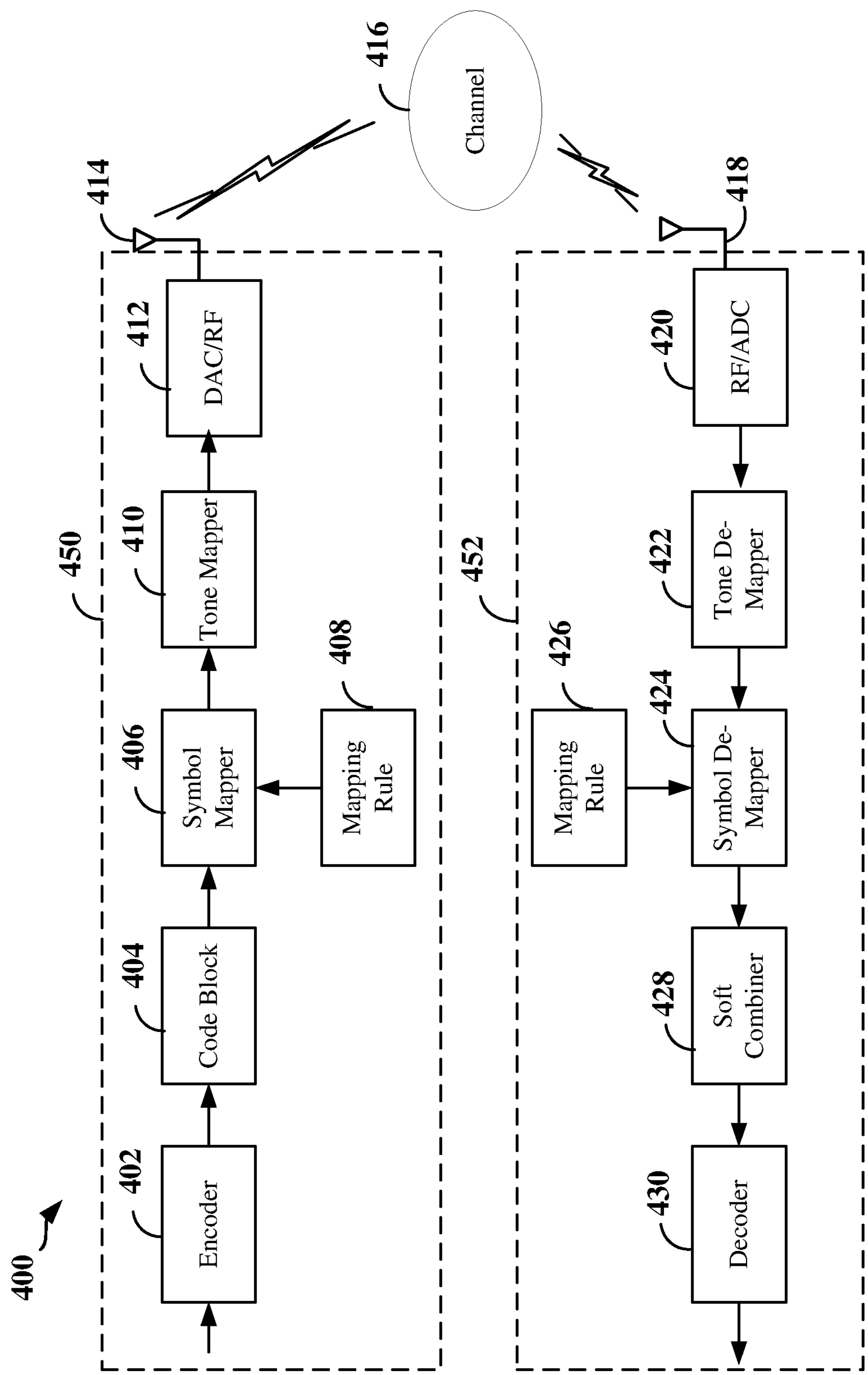
FIG. 4 is a schematic illustration of a wireless communication system as may be implemented between a transmitting device and a receiving device within a radio access network, in accordance with some aspects of the present disclosure.

FIG. 4 is a schematic illustration of a wireless communication system 400 as may be implemented between a transmitter 450 and a receiver 452 within a radio access network, such as the RAN 100 shown in FIG. 1. In some examples, the transmitter 450 may correspond to wireless communication device 202 shown in FIG. 2, and the receiver 452 may correspond to wireless communication device 204 shown in FIG. 2. In addition, one or both of the transmitter 450 and receiver 452 may be configured as wireless communication device 300 shown in FIG. 3.

The transmitter 450 may receive an information message including a plurality of information bits for transmission to the receiver 452. An encoder 402 may be configured to encode the information message using any suitable encoding scheme to produce a code block 404 including a plurality of encoded bits. As described above, the encoded bits may include both systematic bits (e.g., original information bits) and parity bits (e.g., redundancy bits) or only parity bits, depending upon the encoding scheme utilized. The encoder 402 may correspond in some examples to the encoder 224 shown in FIG. 2 or the encoder 342 shown in FIG. 3.

The code block 404 may be input to a symbol mapper 406 to map the encoded bits to modulated symbols using a particular modulation scheme (e.g., QPSK, 16 QAM, 64 QAM, etc.). The symbol mapper 406 may in some examples correspond to the symbol mapper 344 shown in FIG. 3. The modulated symbols are then mapped onto the assigned sub-carriers or tones by a tone mapper 410 to produce modulated sub-carriers. In some examples, the assigned sub-carriers form a set of contiguous tones. The tone mapper 410 may in some examples correspond to the tone mapper 346 shown in FIG. 3.

The modulated sub-carriers may then be converted to the time domain (not shown) to produce output symbols (e.g., OFDM symbols) that may then be input to a digital-to-analog converter (DAC)/radio frequency (RF) block 412 for analog conversion and up-conversion of the respective analog signals to RF. The RF signals may then be transmitted via an antenna 414 (or antenna array).

The RF signal traverses a wireless channel 416 to the receiver 452, where the RF signal is received by an antenna 418, down-converted to baseband, and then converted to a digital signal by an RF/analog-to-digital converter (ADC) block 420. The digital signal is then transformed to a frequency domain signal (not shown), and sub-carrier de-mapping may then be performed by a tone de-mapper 422 to produce modulated symbols. The modulated symbols may then be input to a symbol de-mapper 424 to demodulate the modulated symbols and recover the encoded bits (code block). A decoder 430 may then decode the encoded bits to produce the original bit stream. The decoder 430 may in some examples correspond to the decoder 242 shown in FIG. 2 or the decoder 350 shown in FIG. 3.

If the decoder 430 is unable to decode the encoded bits, a second (retransmitted) code block 404 may be generated by the transmitter 450. In accordance with various aspects of the disclosure, the symbol mapper 406 is further configured to map at least a portion of the corresponding encoded bits (e.g., the encoded bits in both the original and retransmitted code blocks) to different bit locations within the symbols based on a symbol mapping rule 408. The symbol mapping rule 408 may correspond in some examples to the symbol mapping rule 315 shown in FIG. 3.

At the receiver 452, the symbol de-mapper 424 may utilize a symbol mapping rule 426, which may correspond to the symbol mapping rule 408 utilized in the transmitter 450, to identify corresponding/redundant encoded bits in the modulated symbols of the original and retransmitted code blocks and input the corresponding/redundant bits to a soft combiner 428, where the corresponding/redundant bits from the retransmission may be combined with the original transmission before decoding by the decoder 430 to increase the probability of correct reception of each bit. In some examples, the symbol de-mapper 424 may correspond to the retransmission circuitry 348 shown in FIG. 3.

Figure 5:
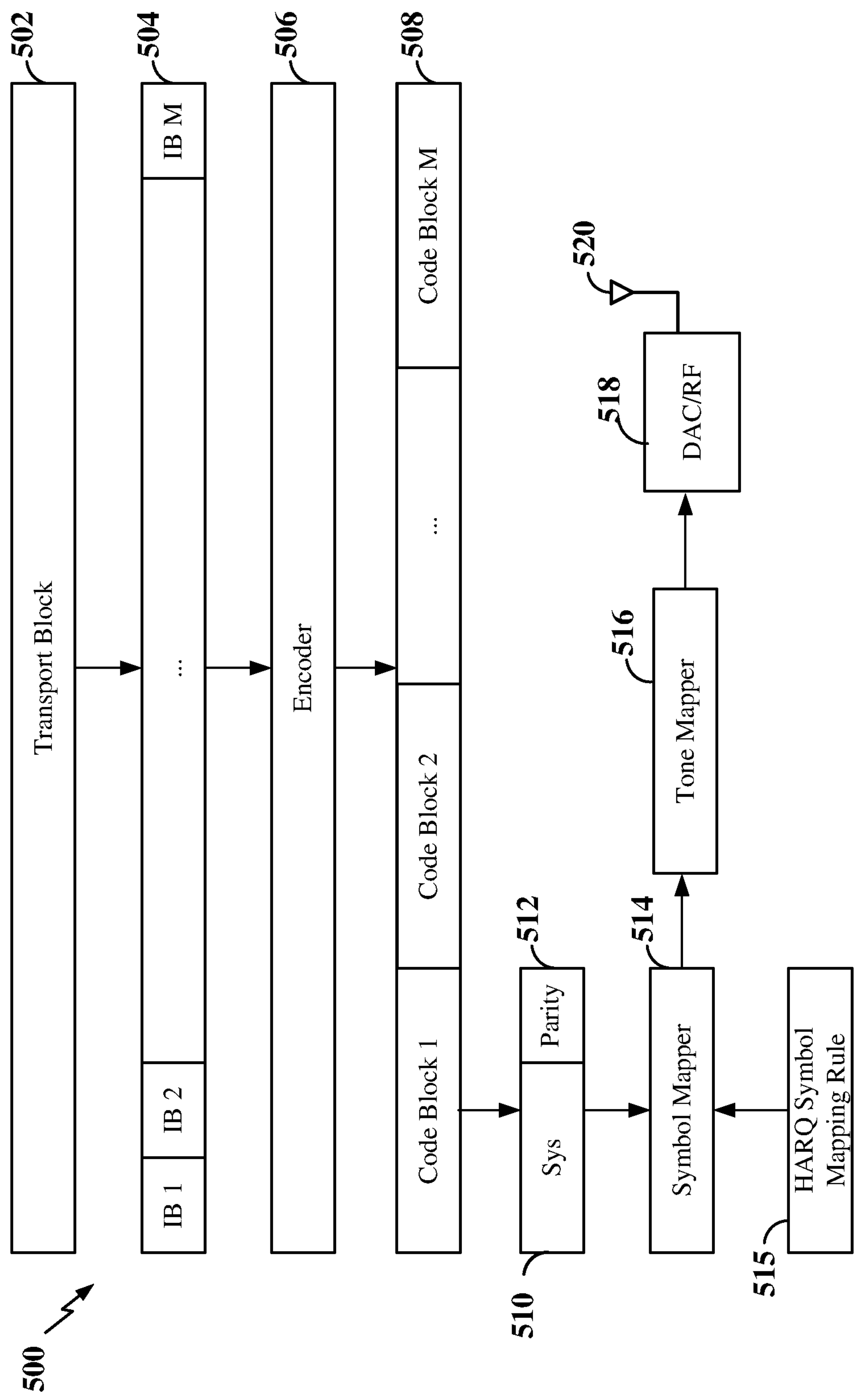
FIG. 5 is a conceptual diagram illustrating a transmitting wireless communication device configured to generate and transmit a code block using a block encoder, in accordance with some aspects of the present disclosure.

FIG. 5 is a conceptual diagram illustrating a transmitting wireless communication device 500 configured to generate and transmit a code block using a block encoder 506. The block encoder 506 may in some examples correspond to the encoder 224 shown in FIG. 2, the encoder 342 shown in FIG. 3 and/or the encoder 402 shown in FIG. 4. The block encoder 506 implements a block coding scheme, as described above. The transmitting wireless communication device 500 may correspond to, for example, the wireless communication device 202 shown in FIG. 2, the wireless communication device 300 shown in FIG. 3 and/or the transmitter 450 shown in FIG. 4.

The transmitting wireless communication device 500 may segment a transport block 502 into M information blocks 504 (e.g., IB1, IB2, . . . IBM), each including a plurality of information bits (systematic bits). Each of the information blocks 504 may then be encoded by a block encoder 506 to produce M code blocks 508 (e.g., Code Block 1, Code Block 2, . . . Code Block M), each corresponding to a respective one of the information blocks 504. Each code block 508 includes systematic bits 510 and parity bits 512. In some examples, the parity bits 512 include parity 0/1 bits for the systematic bits and parity 1/2 bits for a known permutation of the systematic bits.

The systematic bits 510 and parity bits 512 of a code block 508 may then be mapped to symbol bit locations by a symbol mapper 514. The symbol mapper 514 may in some examples correspond to the symbol mapper 344 shown in FIG. 3 and/or the symbol mapper 406 shown in FIG. 4. In examples where the code block 508 is a HARQ retransmission, the symbol mapper 514 may utilize a HARQ symbol mapping rule 515 to map at least a portion of the corresponding encoded bits in the retransmission to different symbol bit locations than in the original transmission. The HARQ symbol mapping rule 515 may in some examples correspond to the symbol mapping rule 315 shown in FIG. 3 and/or the symbol mapping rules 408/426 shown in FIG. 4.

The modulated symbols may then be mapped to respective subcarriers by tone mapper 516, which may correspond to the tone mapper 346 shown in FIG. 3 and/or the tone mapper 410 shown in FIG. 4. The modulated sub-carriers may then be converted to the time domain (not shown) to produce output symbols (e.g., OFDM symbols) that may then be input to a digital-to-analog converter (DAC)/radio frequency (RF) block 518 for analog conversion and up-conversion of the respective analog signals to RF. The RF signals may then be transmitted via an antenna 520 (or antenna array). In some examples, the DAC/RF block 518 and antenna 520 may correspond to the DAC/RF block 412 and antenna 414 shown in FIG. 4.

Figure 6:
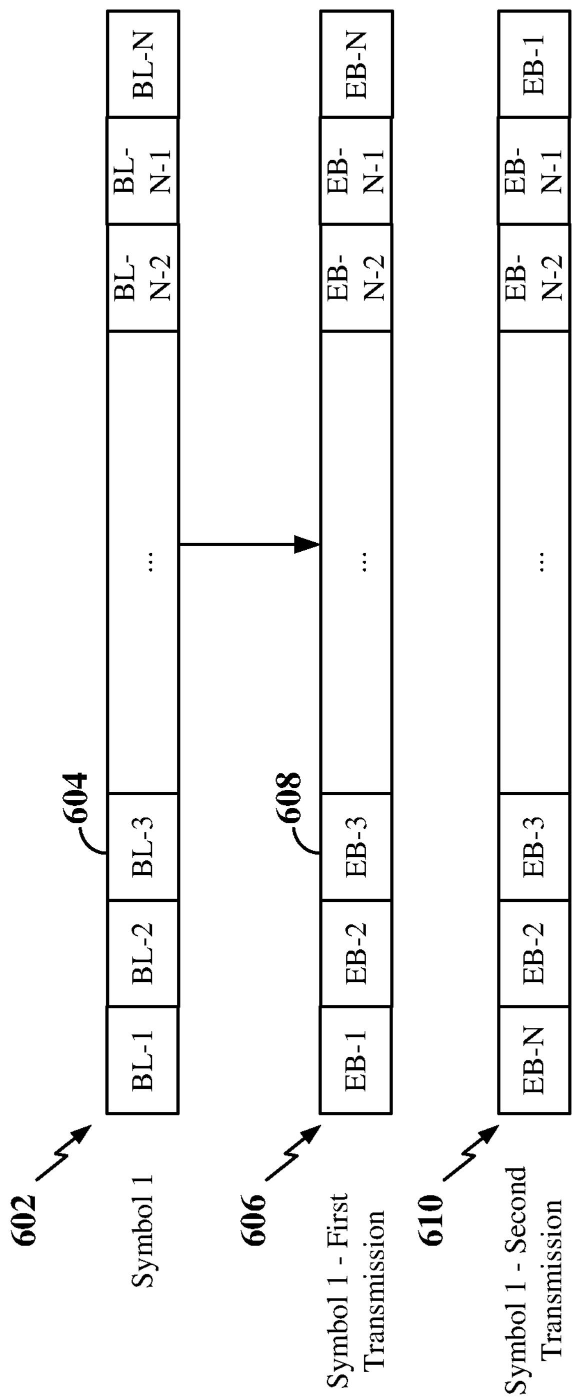
FIG. 6 is a conceptual diagram illustrating an exemplary mapping of encoded bits to a modulated symbol in a first transmission and a second transmission, in accordance with some aspects of the present disclosure.

FIG. 6 is a conceptual diagram illustrating an exemplary mapping of encoded bits to bit locations in a modulated symbol in first (original) transmission and second (retransmitted) transmission. A first symbol 602 (Symbol 1) is illustrated in FIG. 6 having bit locations 604, denoted BL-1, BL-2, BL-3, . . . , BL-N−2, BL-N−1, and BL-N. However, it should be understood that each symbol may include any suitable number of bit locations based on the type of modulation. In a first (original) transmission 606, encoded bits 608, denoted EB-1, EB-2, EB-3, . . . , EB-N−2, EB-N−1, and EB-N may be mapped to the bit locations 604 of Symbol 1 602 in a particular bit order. In the example shown in FIG. 6, EB-1 is mapped to BL-1, EB-2 is mapped to BL-2, EB-3 is mapped to BL-3, EB-N−2 is mapped to BL-N−2, EB-N−1 is mapped to BL-N−1, and EB-N is mapped to BL-N.

Based on the symbol mapping rule, in a retransmission 610 (second transmission), at least a portion of the encoded bits 608 may mapped to different bit locations 604 in Symbol 1 602. In the example shown in FIG. 6, the encoded bit EB-1 in the first bit location BL-1 and the encoded bit EB-N in the last bit location BL-N are switched. Thus, in Symbol 1 of the second transmission, EB-N is mapped to BL-1, EB-2 is mapped to BL-2, EB-3 is mapped to BL-3, EB-N−2 is mapped to BL-N−2, EB-N−1 is mapped to BL-N−1, and EB-1 is mapped to BL-N. Since BL-1 corresponds to the MSB location and BL-N corresponds to the LSB location, by moving EB-N from the LSB location to the MSB location of Symbol 1 in the second transmission, the probability of decoding EB-N may be improved.

Figure 7:
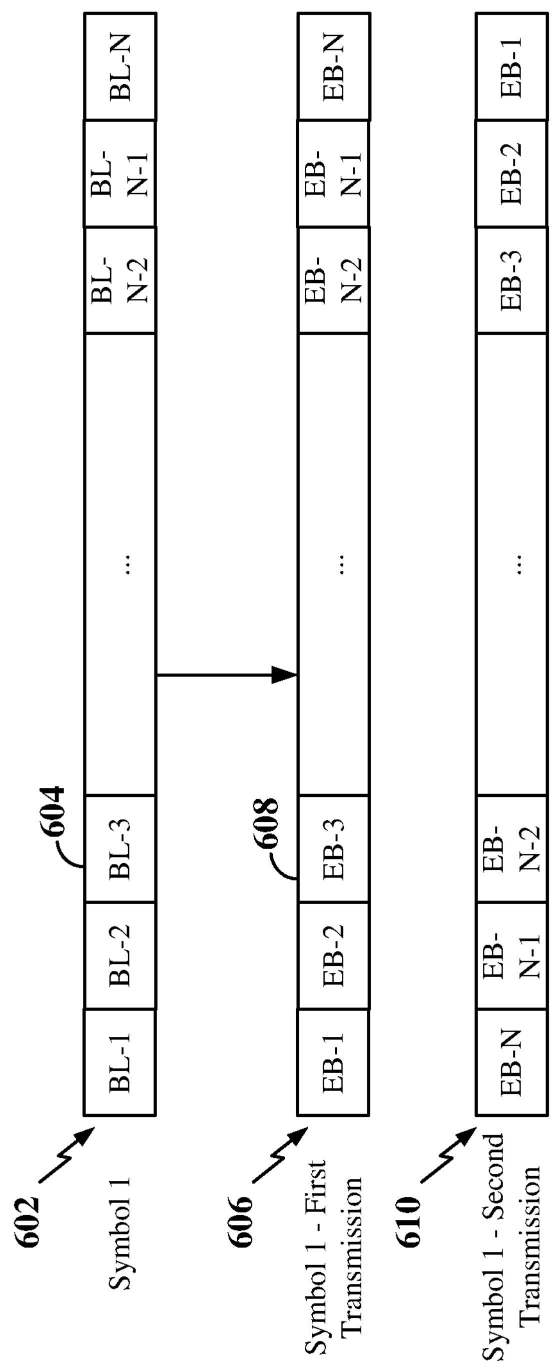
FIG. 7 is a conceptual diagram illustrating another exemplary mapping of encoded bits to a modulated symbol in a first transmission and a second transmission, in accordance with some aspects of the present disclosure.

FIG. 7 is a conceptual diagram illustrating another exemplary mapping of encoded bits to symbol bit locations in a first (original) transmission 606 and a second (retransmitted) transmission 610. As in FIG. 6, a first symbol (Symbol 1) 602 is illustrated in FIG. 7 having bit locations 604, denoted BL-1, BL-2, BL-3, . . . , BL-N−2, BL-N−1, and BL-N. In a first (original) transmission 606, encoded bits 608, denoted EB-1, EB-2, EB-3, . . . , EB-N−2, EB-N−1, and EB-N may be mapped to the bit locations 604 of Symbol 1 602 in a particular bit order. In the example shown in FIG. 7, EB-1 is mapped to BL-1, EB-2 is mapped to BL-2, EB-3 is mapped to BL-3, EB-N−2 is mapped to BL-N−2, EB-N−1 is mapped to BL-N−1, and EB-N is mapped to BL-N.

Based on the symbol mapping rule, in the retransmission (second transmission) 610, at least a portion of the encoded bits 608 may again be mapped to different bit locations 604 in Symbol 1 602. In the example shown in FIG. 7, the bit order is reversed in the second transmission, such that EB-N is mapped to BL-1, EB-N−1 is mapped to BL-2, EB-N−2 is mapped to BL-3, EB-3 is mapped to BL-N−2, EB-2 is mapped to BL-N−1, and EB-1 is mapped to BL-N. By reversing the bit order, the probability of decoding the lower reliability bits (e.g., EB-N−2, EB-N−1, and EB-N) may be improved.

Figure 8:
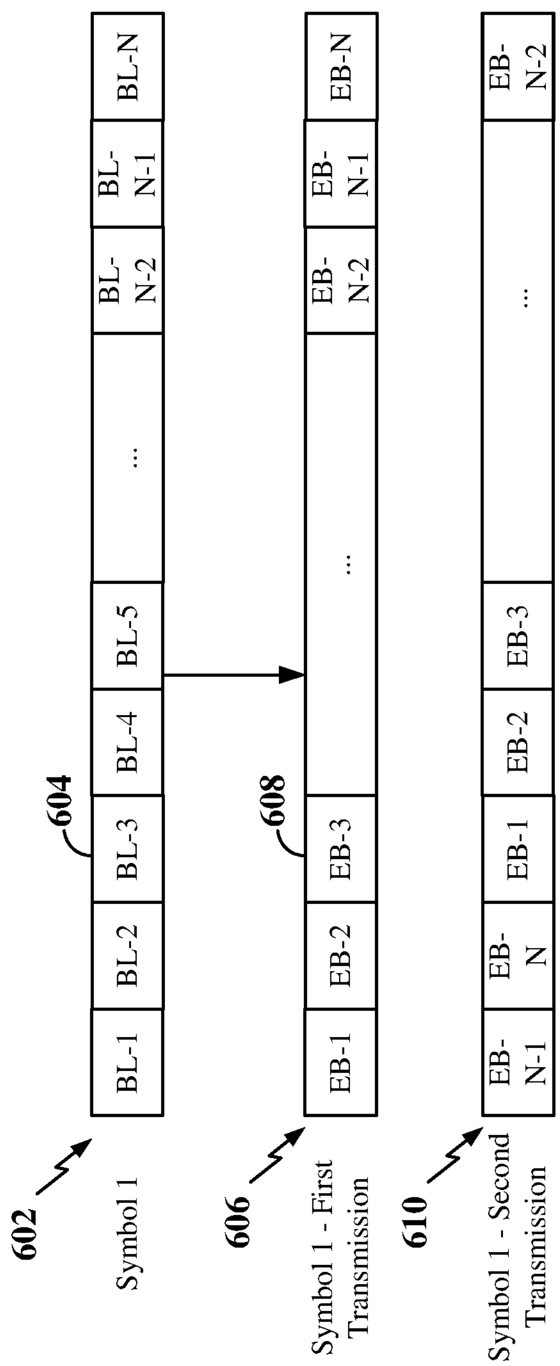
FIG. 8 is a conceptual diagram illustrating another exemplary mapping of encoded bits to a modulated symbol in a first transmission and a second transmission, in accordance with some aspects of the present disclosure.

FIG. 8 is a conceptual diagram illustrating another exemplary mapping of encoded bits to symbol bit locations in a first (original) transmission 606 and a second (retransmitted) transmission 610. As in FIGS. 6 and 7, a first symbol (Symbol 1) 602 is illustrated in FIG. 8 having bit locations 604, denoted BL-1, BL-2, BL-3, BL-4, BL-5, . . . , BL-N−2, BL-N−1, and BL-N. In a first (original) transmission 606, encoded bits 608, denoted EB-1, EB-2, EB-3, . . . , EB-N−2, EB-N−1, and EB-N may be mapped to the bit locations 604 of Symbol 1 602 in a particular bit order. In the example shown in FIG. 8, EB-1 is mapped to BL-1, EB-2 is mapped to BL-2, EB-3 is mapped to BL-3, EB-N−2 is mapped to BL-N−2, EB-N−1 is mapped to BL-N−1, and EB-N is mapped to BL-N.

Based on the symbol mapping rule, in the retransmitted (second) transmission 610, at least a portion of the encoded bits 608 may again be mapped to different bit locations 604 in Symbol 1 602. In the example shown in FIG. 8, a bit location offset of two bit locations is used to shift the order of the bits by two bit locations in Symbol 1. Thus, in Symbol 1 of the second transmission, EB-N−1 is mapped to BL-1, EB-N is mapped to BL-2, EB-1 is mapped to BL-3, EB-2 is mapped to BL-4, EB-3 is mapped to BL-5, and EB-N−2 is mapped to BL-N. By shifting the bit order down two bits to move the last two bits (EB-N−1 and EB-N) to the highest reliability bit locations, the probability of decoding the last two bits (e.g., EB-N−1 and EB-N) may be improved.

Figure 9:
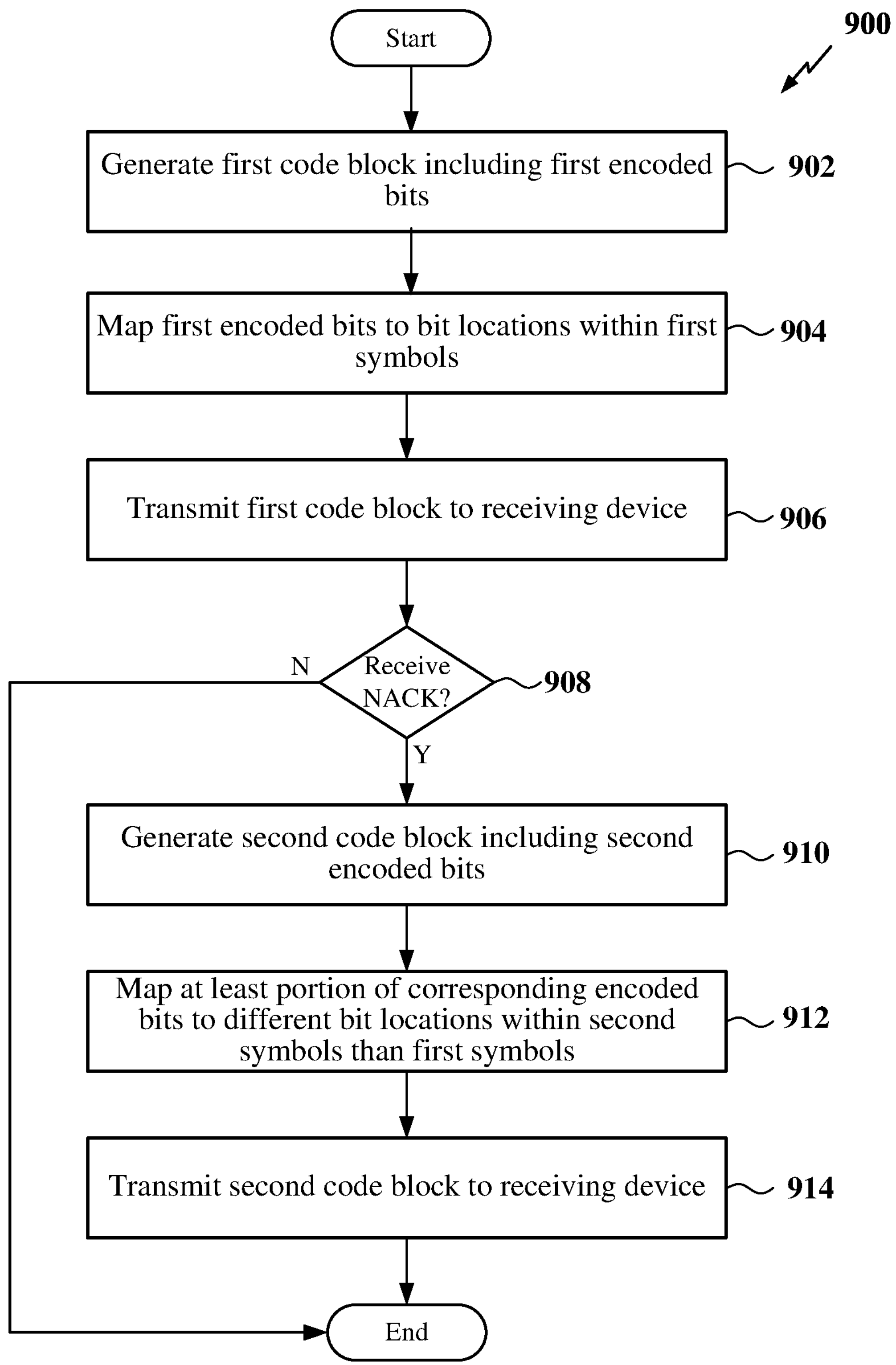
FIG. 9 is a flow chart illustrating an exemplary process for retransmission in a wireless communication network in accordance with some aspects of the present disclosure.

FIG. 9 is a flow chart illustrating an exemplary process 900 for retransmission in a wireless communication network in accordance with some aspects of the present disclosure. As described below, some or all illustrated features may be omitted in a particular implementation within the scope of the present disclosure, and some illustrated features may not be required for implementation of all embodiments. In some examples, the process 900 may be carried out by a transmitting wireless communication device illustrated in any of FIGS. 1-5. In some examples, the process 900 may be carried out by any suitable apparatus or means for carrying out the functions or algorithm described below.

At block 902, the transmitting wireless communication device may generate a first code block including encoded bits. In some examples, the wireless communication device may encode an information message using any suitable encoding scheme to produce the first code block. For example, the encoder 342 shown and described above in reference to FIG. 3 may generate the first code block.

At block 904, the transmitting wireless communication device may map the first encoded bits to first modulation symbols to produce a first transmission, such that each encoded bit is mapped to a respective bit location of one of the first symbols. For example, the symbol mapper 344 shown and described above in reference to FIG. 3 may map the first encoded bits to bit locations within the first symbols.

At block 906, the transmitting wireless communication device may transmit the first transmission including the first symbols over a wireless air interface to a receiving device (e.g., a receiving wireless communication device). For example, the transceiver 310 and communication circuitry 362 shown and described above in reference to FIG. 3 may transmit the first transmission to the receiving wireless communication device. At block 908, the transmitting wireless communication device determines whether a negative acknowledgement (NACK) or no response is received from the receiving device in response to the first transmission.

If a NACK or no response is received (Y branch of block 908), at block 910, the transmitting wireless communication device may generate a second code block including second encoded bits, where at least a portion of the second encoded bits include corresponding encoded bits that correspond to respective ones of the first encoded bits. In some examples, the wireless communication may re-encode the information message to produce the second code block. In other examples, the transmitting wireless communication device may buffer the first code block and utilize the buffered first code block to produce the second code block, which may include the same encoded bits as the first code block, or a portion of the first encoded bits of the first code block optionally together with new encoded bits (e.g., new parity bits or new systematic bits). For example, the encoder 342 and/or retransmission circuitry 348 shown and described above in reference to FIG. 3 may generate the second code block.

At block 912, the transmitting wireless communication device may map the second encoded bits of the second code block to second modulation symbols to produce a second transmission, where at least a portion of the corresponding encoded bits are mapped to different bit locations within the second symbols than the previously transmitted first symbols based on a non-random mapping rule. In some examples, corresponding encoded bits in a modulated symbol of a first transmission may be reversed within a corresponding modulated symbol in the second transmission. In other examples, the first and last encoded bits within a symbol in the first transmission may be switched within a corresponding symbol in the second transmission. Other non-random mapping rules, such as a bit location offset, may also be used to map corresponding encoded bits to different symbol bit locations within corresponding symbols in the first and second transmissions. For example, the symbol mapper 344 and symbol mapping rule 315 shown and described above in reference to FIG. 3 may map at least a portion of the corresponding encoded bits to different bit locations within the second symbols than the first symbols.

At block 914, the transmitting wireless communication device may transmit the second transmission including the second symbols over a wireless air interface to the receiving device. For example, the transceiver 310 and communication circuitry 362 shown and described above in reference to FIG. 3 may transmit the second transmission to the receiving device.

Figure 10:
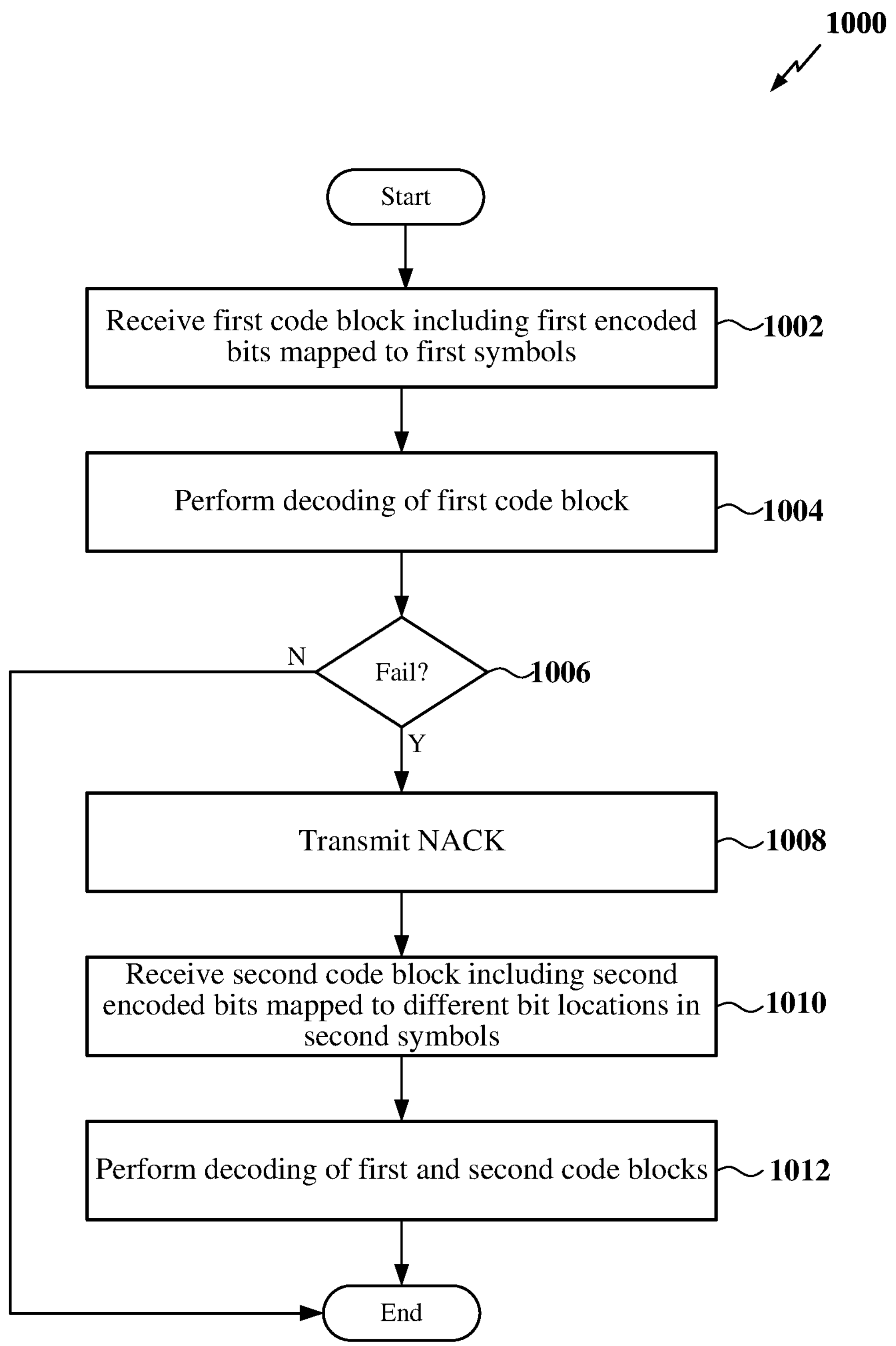
FIG. 10 is a flow chart illustrating an exemplary process for decoding in a wireless communication network in accordance with some aspects of the present disclosure.

FIG. 10 is a flow chart illustrating an exemplary process 1000 for decoding in a wireless communication network in accordance with some aspects of the present disclosure. As described below, some or all illustrated features may be omitted in a particular implementation within the scope of the present disclosure, and some illustrated features may not be required for implementation of all embodiments. In some examples, the process 1000 may be carried out by a receiving wireless communication device illustrated in any of FIGS. 1-4. In some examples, the process 1000 may be carried out by any suitable apparatus or means for carrying out the functions or algorithm described below.

At block 1002, the receiving wireless communication device may receive a first transmission including first encoded bits that are mapped to first symbols from a transmitting device (e.g., transmitting wireless communication device) and de-map the first transmission to produce a first code block. In some examples, the first transmission may be encoded using any suitable encoding scheme and each of the first encoded bits may be mapped to a respective bit location within a respective first symbol based on the type of modulation utilized. For example, the transceiver 310 and communication circuitry 362 shown and described above in reference to FIG. 3 may receive the first code block.

At block 1004, the receiving wireless communication device may perform decoding of the first code block. For example, the decoder 350 shown and described above in reference to FIG. 3 may perform decoding of the first code block. At block 1006, the receiving wireless communication device may determine whether decoding of the first code block fails.

If decoding of the first code block fails (Y branch of block 1006), at block 1008, the receiving wireless communication device may transmit a negative acknowledgement (NACK) to the transmitting device. For example, the retransmission circuitry 348, communication circuitry 362, and transceiver 310 shown and described above in reference to FIG. 3 may transmit the NACK to the transmitting device.

At block 1010, the receiving wireless communication device may receive a second transmission including second encoded bits mapped to second symbols from the transmitting device and de-map the second transmission to produce a second code block. In aspects of the disclosure, at least a portion of the second encoded bits are corresponding encoded bits that correspond to respective ones of the first encoded bits. In addition, at least a portion of the corresponding encoded bits may be mapped to different bit locations within the second symbols than the first symbols based on a non-random mapping rule. In some examples, corresponding encoded bits of a first symbol may be reversed within a corresponding second symbol. In other examples, the first and last encoded bits within a first symbol may be switched within a corresponding second symbol. Other non-random mapping rules, such as a bit location offset, may also be used to map corresponding encoded bits to different symbol bit locations within corresponding first and second symbols. For example, the transceiver 310, communication circuitry 362, and retransmission circuitry 348 shown and described above in reference to FIG. 3 may receive the second code block from the transmitting device.

At block 1012, the receiving wireless communication device may perform decoding of the first and second code blocks by soft combining the corresponding encoded bits based on the non-random mapping rule. For example, the retransmission circuitry 348 shown and described above in reference to FIG. 3 may soft combine the corresponding encoded bits, as determined from the symbol mapping rule 315, and the decoder 350 may then decode the first code block using the combined encoded bits.

Figure 11:
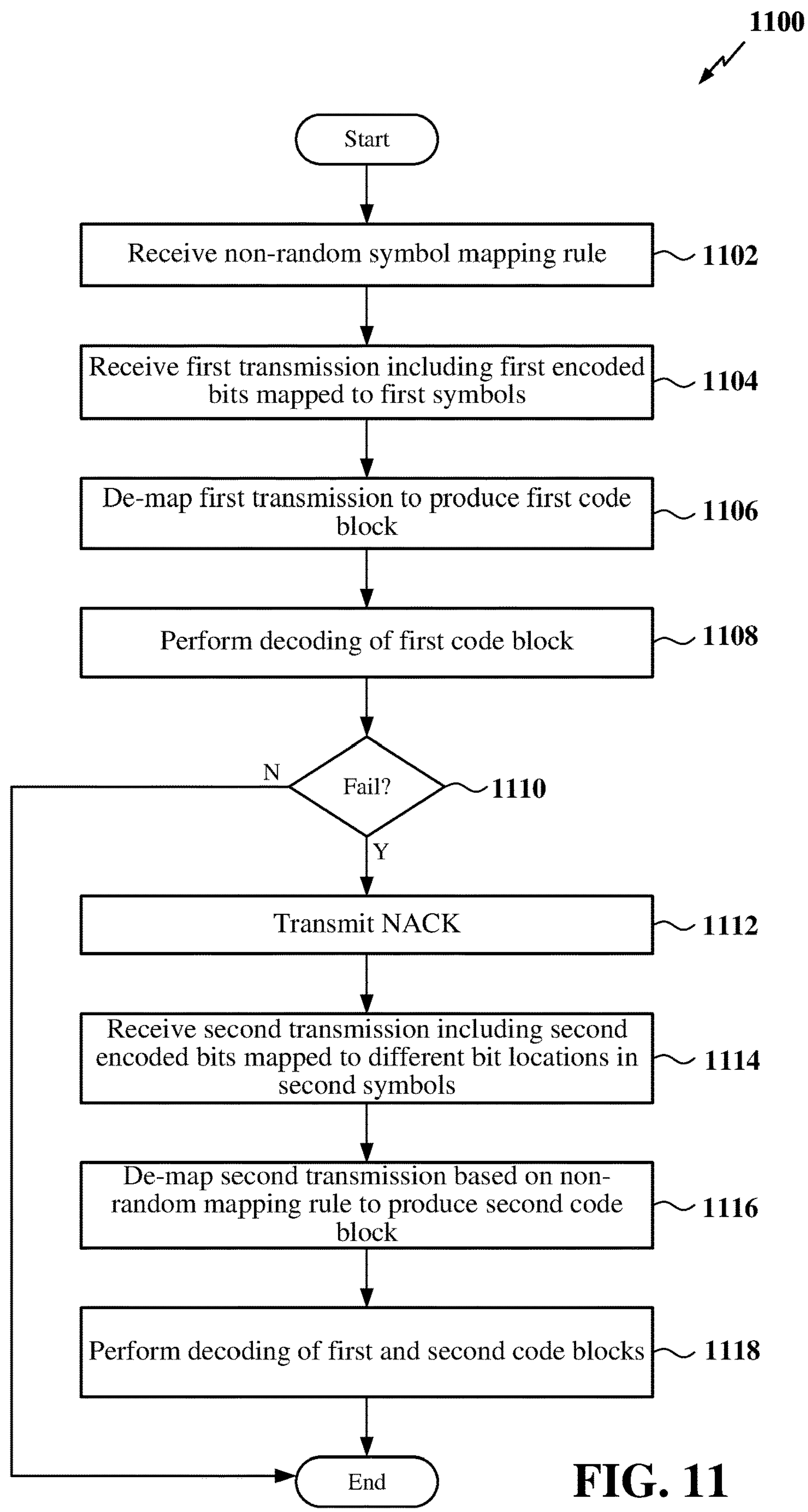
FIG. 11 is a flow chart illustrating another exemplary process for decoding in a wireless communication network in accordance with some aspects of the present disclosure.

FIG. 11 is a flow chart illustrating an exemplary process 1100 for decoding in a wireless communication network in accordance with some aspects of the present disclosure. As described below, some or all illustrated features may be omitted in a particular implementation within the scope of the present disclosure, and some illustrated features may not be required for implementation of all embodiments. In some examples, the process 1100 may be carried out by a receiving wireless communication device illustrated in any of FIGS. 1-4. In some examples, the process 1100 may be carried out by any suitable apparatus or means for carrying out the functions or algorithm described below.

At block 1102, the receiving wireless communication device may receive a non-random symbol mapping rule. In some examples, the symbol mapping rule may be received via a radio resource control (RRC) message, master information block (MIB), system information block (SIB), or downlink control information (DCI). In some examples, the receiving wireless communication device may receive and/ or maintain two or more symbol mapping rules and select one of the symbol mapping rules for a transmission. For example, the receiving wireless communication device may receive an indication of a selected one of the symbol mapping rules for one or more transmissions. For example, the communication circuitry 362 together with the transceiver 310 may receive the non-random symbol mapping rule.

At block 1104, the receiving wireless communication device may receive a first transmission including first encoded bits that are mapped to first symbols from a transmitting device (e.g., transmitting wireless communication device). In some examples, the first transmission may be encoded using any suitable encoding scheme and each of the first encoded bits may be mapped to a respective bit location within a respective first symbol based on the type of modulation utilized. For example, the transceiver 310 and communication circuitry 362 shown and described above in reference to FIG. 3 may receive the first code block.

At block 1106, the receiving wireless communication device may de-map the first transmission to produce a first code block. For example, the receiving wireless communication device may demodulate the modulated symbols in the received first transmission to recover the encoded bits corresponding to the first code block. For example, the symbol mapper 344 (operating as a symbol de-mapper) shown and described above in reference to FIG. 3 and/or symbol de-mapper 424 shown and described above in reference to FIG. 4 may de-map the first transmission to produce the first code block.

At block 1108, the receiving wireless communication device may perform decoding of the first code block. For example, the decoder 350 shown and described above in reference to FIG. 3 may perform decoding of the first code block. At block 1110, the receiving wireless communication device may determine whether decoding of the first code block fails.

If decoding of the first code block fails (Y branch of block 1110), at block 1112, the receiving wireless communication device may transmit a negative acknowledgement (NACK) to the transmitting device. For example, the retransmission circuitry 348 and transceiver 310 and communication circuitry 362 shown and described above in reference to FIG. 3 may transmit the NACK to the transmitting device.

At block 1114, the receiving wireless communication device may receive a second transmission including second encoded bits mapped to second symbols from the transmitting device. In aspects of the disclosure, at least a portion of the second encoded bits are corresponding encoded bits that correspond to respective ones of the first encoded bits. In addition, at least a portion of the corresponding encoded bits may be mapped to different bit locations within the second symbols than the first symbols based on a non-random mapping rule. In some examples, corresponding encoded bits of a first symbol may be reversed within a corresponding second symbol. In other examples, the first and last encoded bits within a first symbol may be switched within a corresponding second symbol. Other non-random mapping rules, such as a bit location offset, may also be used to map corresponding encoded bits to different symbol bit locations within corresponding first and second symbols. For example, the transceiver 310, communication circuitry 362, and retransmission circuitry 348 shown and described above in reference to FIG. 3 may receive the second code block from the transmitting device.

At block 1116, the receiving wireless communication device may de-map the second transmission to produce a second code block based on the non-random symbol mapping rule received at block 1102. In some examples, for corresponding symbols (e.g., first and second symbols that correspond between the first and second transmissions), the non-random symbol mapping rule may specify how the first and second bit orders differ or how the first set of encoded bits in the first code block are mapped to the second set of encoded bits in the second code block. For example, the symbol mapper 344 (operating as a symbol de-mapper) shown and described above in reference to FIG. 3 and/or symbol de-mapper 424 shown and described above in reference to FIG. 4 may de-map the second transmission to produce the second code block.

At block 1118, the receiving wireless communication device may perform decoding of the first and second code blocks by soft combining the corresponding encoded bits based on the non-random mapping rule. For example, the retransmission circuitry 348 shown and described above in reference to FIG. 3 may soft combine the corresponding encoded bits, as determined from the symbol mapping rule 315, and the decoder 350 may then decode the first code block using the combined encoded bits.

In one configuration, a wireless communication device within a wireless communication network includes means for generating a first code block including first encoded bits and means for mapping the first encoded bits of the first code block to first symbols to produce a first transmission, in which each of the first encoded bits is mapped to a respective bit location of one of the first symbols. The wireless communication device further includes means for transmitting the first transmission including the first symbols over a wireless air interface to a receiving device, means for receiving a negative acknowledgement (NACK) or no response, in response to the first transmission, and means for generating a second code block including second encoded bits, in which at least a portion of the second encoded bits include corresponding encoded bits that correspond to respective ones of the first encoded bits. The wireless communication device further includes means for mapping the second encoded bits of the second code block to second symbols to produce a second transmission, in which at least a portion of the corresponding encoded bits are mapped to different bit locations within the second symbols than the first symbols based on a non-random mapping rule, and means for transmitting the second transmission including the second symbols over the wireless air interface to the receiving device.

In one aspect, the aforementioned means for generating the first code block, means for mapping the first encoded bits of the first code block to the first symbols of a first transmission, the means for generating the second code block, and the means for mapping the second encoded bits of the second code block to the second symbols of the second transmission may be the processor(s) 304 shown in FIG. 3 configured to perform the functions recited by the aforementioned means. For example, the aforementioned means for generating the first code and for generating the second code block may include the encoder 342 shown in FIG. 3. As another example, the aforementioned means for mapping the first encoded bits to the first symbols and the second encoded bits to the second symbols may include the symbol mapper 344 shown in FIG. 3. In another aspect, the aforementioned means for transmitting the first transmission, means for receiving the NACK or no response, and means for transmitting the second transmission may be the processor(s) 304 shown in FIG. 3 configured to perform the functions recited by the aforementioned means, along with the transceiver 310 shown in FIG. 3. For example, the aforementioned means for transmitting and/or receiving may include the communication circuitry 362 shown in FIG. 3, together with the transceiver 310 shown in FIG. 3. In still another aspect, the aforementioned means may be a circuit or any apparatus configured to perform the functions recited by the aforementioned means.

In another configuration, a wireless communication device within a wireless communication network includes means for receiving a first transmission including first encoded bits mapped to first symbols over a wireless air interface from a transmitting device, in which each of the first encoded bits is mapped to a respective bit location of one of the first symbols. The wireless communication device further includes means for de-mapping the first transmission to produce a first code block including the first encoded bits, means for performing decoding of the first code block, and if decoding of the first code block fails, means for transmitting a negative acknowledgement (NACK) to the transmitting device. The wireless communication device further includes means for receiving a second transmission including second encoded bits mapped to second symbols over the wireless air interface from the transmitting device, in which at least a portion of the second encoded bits include corresponding encoded bits that correspond to respective ones of the first encoded bits and at least a portion of the corresponding encoded bits are mapped to different bit locations within the second symbols than the first symbols based on a non-random mapping rule. The wireless communication device further includes means for de-mapping the second transmission to produce a second code block including the second encoded bits and means for performing decoding of the first code block and the second code block by soft combining the corresponding encoded bits.

In one aspect, the aforementioned means for receiving the first transmission, means for transmitting the NACK, and means for receiving the second transmission may be the processor(s) 304 shown in FIG. 3 configured to perform the functions recited by the aforementioned means, along with the transceiver 310 shown in FIG. 3. For example, the aforementioned means for transmitting and/or receiving may include the communication circuitry 362 shown in FIG. 3, together with the transceiver 310 shown in FIG. 3. In another aspect, the aforementioned means for de-mapping the first transmission to produce the first code block, means for performing decoding the first code block, means for de-mapping the second transmission to produce the second code block, and means for performing decoding of the first and second code blocks may be the processor(s) 304 shown in FIG. 3 configured to perform the functions recited by the aforementioned means. For example, the aforementioned means for performing decoding may include the decoder 350 shown in FIG. 3. As another example, the aforementioned means for de-mapping may include the symbol mapper 344 (operating as a de-mapper) shown in FIG. 3 or the de-mapper 424 shown in FIG. 4. In still another aspect, the aforementioned means may be a circuit or any apparatus configured to perform the functions recited by the aforementioned means.

Several aspects of a wireless communication network have been presented with reference to an exemplary implementation. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word “exemplary” is used to mean “serving as an example, instance, or illustration.” Any implementation or aspect described herein as “exemplary” is not necessarily to be construed as preferred or advantageous over other aspects of the disclosure. Likewise, the term “aspects” does not require that all aspects of the disclosure include the discussed feature, advantage or mode of operation. The term “coupled” is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms “circuit” and “circuitry” are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-11 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1, 2, 7 and/or 9 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean “one and only one” unless specifically so stated, but rather “one or more.”

Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of retransmission within a wireless communication network, the method comprising:

transmitting a plurality of non-random mapping rules over a wireless air interface from a transmitting device to a receiving device;

receiving a selected non-random mapping rule of the plurality of non-random mapping rules to be utilized by the transmitting device in a retransmission over the wireless air interface from the receiving device, wherein the selected non-random mapping rule indicates a mapping of encoded bits to symbol bit locations for a particular modulation and coding scheme, and wherein the mapping is different between the retransmission and a first transmission;

generating a first code block comprising first encoded bits;

mapping the first encoded bits of the first code block to first symbols to produce the first transmission, wherein each of the first encoded bits is mapped to a respective bit location of one of the first symbols;

transmitting the first transmission comprising the first symbols over the wireless air interface to the receiving device;

receiving a negative acknowledgement (NACK) or no response, in response to the first transmission;

generating a second code block comprising second encoded bits, at least a portion of the second encoded bits comprising corresponding encoded bits that correspond to respective ones of the first encoded bits;

mapping the second encoded bits of the second code block to second symbols to produce a second transmission, wherein at least a portion of the corresponding encoded bits are mapped to different bit locations within the second symbols than the first symbols based on the selected non-random mapping rule; and transmitting the second transmission comprising the second symbols over the wireless air interface to the receiving device.

2. The method of claim 1, wherein the first encoded bits and the second encoded bits are the same.

3. The method of claim 1, wherein:

a given symbol of the first symbols comprises a first set of the first encoded bits arranged in a first bit order from a most significant bit (MSB) location to a least significant bit (LSB) location; and a corresponding symbol of the second symbols corresponding to the given symbol comprises a second set of the second encoded bits arranged in a second bit order from the MSB location to the LSB location.

4. The method of claim 3, wherein:

the first set of the first encoded bits and the second set of the second encoded bits are the same; and the first bit order is different than the second bit order.

5. The method of claim 4, wherein mapping the second encoded bits of the second code block to the second symbols further comprises:

mapping an initial encoded bit of the first set of the first encoded bits in the MSB location in the given symbol to the LSB location in the corresponding symbol; and mapping a last encoded bit of the first set of the first encoded bits in the LSB location in the given symbol to the MSB location in the corresponding symbol.

6. The method of claim 4, wherein mapping the second encoded bits of the second code block to the second symbols further comprises:

reversing the first bit order to produce the second bit order.

7. The method of claim 4, wherein mapping the second encoded bits of the second code block to the second symbols further comprises:

mapping the second set of the second encoded bits to the corresponding symbol based on a bit location offset between the first bit order and the second bit order.

8. The method of claim 1, wherein transmitting the plurality of non-random mapping rules further comprises:

transmitting the plurality of non-random mapping rules to the receiving device via a radio resource control (RRC) message, a master information block (MIB), a system information block (SIB), downlink control information (DCI), or a combination thereof.

9. An apparatus configured for wireless communication, comprising:

a transceiver;

a memory; and a processor communicatively coupled to the transceiver and the memory, the processor configured to:

transmit a plurality of non-random mapping rules over a wireless air interface to a receiving device via the transceiver;

receive a selected non-random mapping rule of the plurality of non-random mapping rules to be utilized by the apparatus in a retransmission over the wireless air interface from the receiving device via the transceiver, wherein the selected non-random mapping rule indicates a mapping of encoded bits to symbol bit locations for a particular modulation and coding scheme, and wherein the mapping is different between the retransmission and a first transmission;

generate a first code block comprising first encoded bits;

map the first encoded bits of the first code block to first symbols to produce the first transmission, wherein each of the first encoded bits is mapped to a respective bit location of one of the first symbols;

transmit the first transmission comprising the first symbols over the wireless air interface via the transceiver to the receiving device;

receive a negative acknowledgement (NACK) or no response, in response to the first transmission via the transceiver;

generate a second code block comprising second encoded bits, at least a portion of the second encoded bits comprising corresponding encoded bits that correspond to respective ones of the first encoded bits;

map the second encoded bits of the second code block to second symbols to produce a second transmission, wherein at least a portion of the corresponding encoded bits are mapped to different bit locations within the second symbols than the first symbols based on the selected non-random mapping rule; and transmit the second transmission comprising the second symbols over the wireless air interface via the transceiver to the receiving device.

10. The apparatus of claim 9, wherein the first encoded bits and the second encoded bits are the same.

11. The apparatus of claim 9, wherein:

a given symbol of the first symbols comprises a first set of the first encoded bits arranged in a first bit order from a most significant bit (MSB) location to a least significant bit (LSB) location; and a corresponding symbol of the second symbols corresponding to the given symbol comprises a second set of the second encoded bits arranged in a second bit order from the MSB location to the LSB location.

12. The apparatus of claim 11, wherein:

the first set of the first encoded bits and the second set of the second encoded bits are the same; and the first bit order is different than the second bit order.

13. The apparatus of claim 12, wherein the processor is further configured to:

map an initial encoded bit of the first set of the first encoded bits in the MSB location in the given symbol to the LSB location in the corresponding symbol; and map a last encoded bit of the first set of the first encoded bits in the LSB location in the given symbol to the MSB location in the corresponding symbol.

14. The apparatus of claim 12, wherein the processor is further configured to:

reverse the first bit order to produce the second bit order.

15. The apparatus of claim 12, wherein the processor is further configured to:

map the second set of the second encoded bits to the corresponding symbol based on a bit location offset between the first bit order and the second bit order.

16. The apparatus of claim 9, wherein the processor is further configured to:

transmit, via the transceiver, the plurality of non-random mapping rules to the receiving device via a radio resource control (RRC) message, a master information block (MIB), a system information block (SIB), downlink control information (DCI), or a combination thereof.

17. A wireless communication device within a wireless communication network, comprising:

means for transmitting a plurality of non-random mapping rules over a wireless air interface to a receiving device;

means for receiving a selected non-random mapping rule of the plurality of non-random mapping rules to be utilized by the wireless communication device in a retransmission over the wireless air interface from the receiving device, wherein the selected non-random mapping rule indicates a mapping of encoded bits to symbol bit locations for a particular modulation and coding scheme, and wherein the mapping is different between the retransmission and a first transmission;

means for generating a first code block comprising first encoded bits;

means for mapping the first encoded bits of the first code block to first symbols to produce the first transmission, wherein each of the first encoded bits is mapped to a respective bit location of one of the first symbols;

means for transmitting the first transmission comprising the first symbols over the wireless air interface to the receiving device;

means for receiving a negative acknowledgement (NACK) or no response, in response to the first transmission;

means for generating a second code block comprising second encoded bits, at least a portion of the second encoded bits comprising corresponding encoded bits that correspond to respective ones of the first encoded bits;

means for mapping the second encoded bits of the second code block to second symbols to produce a second transmission, wherein at least a portion of the corresponding encoded bits are mapped to different bit locations within the second symbols than the first symbols based on the selected non-random mapping rule; and means for transmitting the second transmission comprising the second symbols over the wireless air interface to the receiving device.

18. The wireless communication device of claim 17, wherein the first encoded bits and the second encoded bits are the same.

19. The wireless communication device of claim 17, wherein:

a given symbol of the first symbols comprises a first set of the first encoded bits arranged in a first bit order from a most significant bit (MSB) location to a least significant bit (LSB) location; and a corresponding symbol of the second symbols corresponding to the given symbol comprises a second set of the second encoded bits arranged in a second bit order from the MSB location to the LSB location.

20. The wireless communication device of claim 19, wherein:

the first set of the first encoded bits and the second set of the second encoded bits are the same; and the first bit order is different than the second bit order.

21. The wireless communication device of claim 20, wherein the means for mapping the second encoded bits of the second code block to the second symbols further comprises:

means for mapping an initial encoded bit of the first set of the first encoded bits in the MSB location in the given symbol to the LSB location in the corresponding symbol; and means for mapping a last encoded bit of the first set of the first encoded bits in the LSB location in the given symbol to the MSB location in the corresponding symbol.

22. The wireless communication device of claim 20, wherein the means for mapping the second encoded bits of the second code block to the second symbols further comprises:

means for reversing the first bit order to produce the second bit order.

23. The wireless communication device of claim 20, wherein the means for mapping the second encoded bits of the second code block to the second symbols further comprises:

means for mapping the second set of the second encoded bits to the corresponding symbol based on a bit location offset between the first bit order and the second bit order.

24. The wireless communication device of claim 17, wherein the means for transmitting the plurality of non-random mapping rules further comprises:

means for transmitting the plurality of non-random mapping rules to the receiving device via a radio resource control (RRC) message, a master information block (MIB), a system information block (SIB), downlink control information (DCI), or a combination thereof.

25. A method of decoding in a wireless communication network, the method comprising:

receiving a plurality of non-random mapping rules over a wireless air interface from a transmitting device;

selecting a selected non-random mapping rule of the plurality of non-random mapping rules to be utilized by the transmitting device in a retransmission, wherein the selected non-random mapping rule indicates a mapping of encoded bits to symbol bit locations for a particular modulation and coding scheme, and wherein the mapping is different between the retransmission and a first transmission;

transmitting the selected non-random mapping rule of the plurality of non-random mapping rules over the wireless air interface to the transmitting device;

receiving the first transmission comprising first encoded bits mapped to first symbols over the wireless air interface from the transmitting device, wherein each of the first encoded bits is mapped to a respective bit location of one of the first symbols;

de-mapping the first transmission to produce a first code block comprising the first encoded bits;

performing decoding of the first code block;

if decoding of the first code block fails, transmitting a negative acknowledgement (NACK) to the transmitting device;

receiving a second transmission comprising second encoded bits mapped to second symbols over the wireless air interface from the transmitting device, wherein at least a portion of the second encoded bits comprise corresponding encoded bits that correspond to respective ones of the first encoded bits and at least a portion of the corresponding encoded bits are mapped to different bit locations within the second symbols than the first symbols based on the selected non-random mapping rule;

de-mapping the second transmission to produce a second code block comprising the second encoded bits; and performing decoding of the first code block and the second code block by soft combining the corresponding encoded bits.

26. The method of claim 25, wherein the first encoded bits and the second encoded bits are the same.

27. The method of claim 25, wherein:

a given symbol of the first symbols comprises a first set of the first encoded bits arranged in a first bit order from a most significant bit (MSB) location to a least significant bit (LSB) location; and a corresponding symbol of the second symbols corresponding to the given symbol comprises a second set of the second encoded bits arranged in a second bit order from the MSB location to the LSB location.

28. The method of claim 27, wherein:

the first set of the first encoded bits and the second set of the second encoded bits are the same; and the first bit order is different than the second bit order.

29. The method of claim 28, wherein:

an initial encoded bit of the first set of the first encoded bits in the MSB location in the given symbol is located within the LSB location in the corresponding symbol; and a last encoded bit of the first set of the first encoded bits in the LSB location in the given symbol is located in the MSB location in the corresponding symbol.

30. The method of claim 28, wherein the second bit order comprises a reverse of the first bit order.

31. The method of claim 28, wherein the second set of the second encoded bits comprises a bit location offset between the first bit order and the second bit order.

32. The method of claim 25, wherein receiving the plurality of non-random mapping rules further comprises:

receiving the plurality of non-random mapping rules from the transmitting device via a radio resource control (RRC) message, a master information block (MIB), a system information block (SIB), downlink control information (DCI), or a combination thereof.

33. An apparatus configured for wireless communication, comprising:

a transceiver;

a memory; and a processor communicatively coupled to the transceiver and the memory, the processor configured to:

receive a plurality of non-random mapping rules over a wireless air interface from a transmitting device via the transceiver;

select a selected non-random mapping rule of the plurality of non-random mapping rules to be utilized by the transmitting device in a retransmission, wherein the selected non-random mapping rule indicates a mapping of encoded bits to symbol bit locations for a particular modulation and coding scheme, and wherein the mapping is different between the retransmission and a first transmission;

transmit the selected non-random mapping rule of the plurality of non-random mapping rules over the wireless air interface to the transmitting device via the transceiver;

receive the first transmission comprising first encoded bits mapped to first symbols over the wireless air interface via the transceiver from the transmitting device, wherein each of the first encoded bits is mapped to a respective bit location of one of the first symbols;

de-map the first transmission to produce a first code block comprising the first encoded bits;

perform decoding of the first code block;

if decoding of the first code block fails, transmit a negative acknowledgement (NACK) to the transmitting device via the transceiver;

receive a second transmission comprising second encoded bits mapped to second symbols over the wireless air interface via the transceiver from the transmitting device, wherein at least a portion of the second encoded bits comprise corresponding encoded bits that correspond to respective ones of the first encoded bits and at least a portion of the corresponding encoded bits are mapped to different bit locations within the second symbols than the first symbols based on the selected non-random mapping rule;

de-map the second transmission to produce a second code block comprising the second encoded bits; and perform decoding of the first code block and the second code block by soft combining the corresponding encoded bits.

34. The apparatus of claim 33, wherein the first encoded bits and the second encoded bits are the same.

35. The apparatus of claim 33, wherein:

a given symbol of the first symbols comprises a first set of the first encoded bits arranged in a first bit order from a most significant bit (MSB) location to a least significant bit (LSB) location; and a corresponding symbol of the second symbols corresponding to the given symbol comprises a second set of the second encoded bits arranged in a second bit order from the MSB location to the LSB location.

36. The apparatus of claim 35, wherein:

the first set of the first encoded bits and the second set of the second encoded bits are the same; and the first bit order is different than the second bit order.

37. The apparatus of claim 36, wherein:

an initial encoded bit of the first set of the first encoded bits in the MSB location in the given symbol is located within the LSB location in the corresponding symbol; and a last encoded bit of the first set of the first encoded bits in the LSB location in the given symbol is located in the MSB location in the corresponding symbol.

38. The apparatus of claim 36, wherein the second bit order comprises a reverse of the first bit order.

39. The apparatus of claim 36, wherein the second set of the second encoded bits comprises a bit location offset between the first bit order and the second bit order.

40. The apparatus of claim 33, wherein the processor is further configured to:

receive, via the transceiver, the plurality of non-random mapping rules from the transmitting device via a radio resource control (RRC) message, a master information block (MIB), a system information block (SIB), downlink control information (DCI), or a combination thereof; and store the selected non-random mapping rule in the memory.

41. A wireless communication device in a wireless communication network, comprising:

means for receiving a plurality of non-random mapping rules over a wireless air interface from a transmitting device;

means for selecting a selected non-random mapping rule of the plurality of non-random mapping rules to be utilized by the transmitting device in a retransmission, wherein the selected non-random mapping rule indicates a mapping of encoded bits to symbol bit locations for a particular modulation and coding scheme, and wherein the mapping is different between the retransmission and a first transmission;

means for transmitting the selected non-random mapping rule of the plurality of non-random mapping rules over the wireless air interface to the transmitting device;

means for receiving the first transmission comprising first encoded bits mapped to first symbols over the wireless air interface from the transmitting device, wherein each of the first encoded bits is mapped to a respective bit location of one of the first symbols;

means for de-mapping the first transmission to produce a first code block comprising the first encoded bits;

means for performing decoding of the first code block;

if decoding of the first code block fails, means for transmitting a negative acknowledgement (NACK) to the transmitting device;

means for receiving a second transmission comprising second encoded bits mapped to second symbols over the wireless air interface from the transmitting device, wherein at least a portion of the second encoded bits comprise corresponding encoded bits that correspond to respective ones of the first encoded bits and at least a portion of the corresponding encoded bits are mapped to different bit locations within the second symbols than the first symbols based on the selected non-random mapping rule;

means for de-mapping the second transmission to produce a second code block comprising the second encoded bits; and means for performing decoding of the first code block and the second code block by soft combining the corresponding encoded bits.

42. The wireless communication device of claim 41, wherein the first encoded bits and the second encoded bits are the same.

43. The wireless communication device of claim 41, wherein:

a given symbol of the first symbols comprises a first set of the first encoded bits arranged in a first bit order from a most significant bit (MSB) location to a least significant bit (LSB) location; and a corresponding symbol of the second symbols corresponding to the given symbol comprises a second set of the second encoded bits arranged in a second bit order from the MSB location to the LSB location.

44. The wireless communication device of claim 43, wherein:

the first set of the first encoded bits and the second set of the second encoded bits are the same; and the first bit order is different than the second bit order.

45. The wireless communication device of claim 44, wherein:

an initial encoded bit of the first set of the first encoded bits in the MSB location in the given symbol is located within the LSB location in the corresponding symbol; and a last encoded bit of the first set of the first encoded bits in the LSB location in the given symbol is located in the MSB location in the corresponding symbol.

46. The wireless communication device of claim 44, wherein the second bit order comprises a reverse of the first bit order.

47. The wireless communication device of claim 44, wherein the second set of the second encoded bits comprises a bit location offset between the first bit order and the second bit order.

48. The wireless communication device of claim 41, wherein the means for receiving the plurality of non-random mapping rules further comprises:

means for receiving the plurality of non-random mapping rules from the transmitting device via a radio resource control (RRC) message, a master information block (MIB), a system information block (SIB), downlink control information (DCI), or a combination thereof.

* * * * *